United States Patent
Truong et al.

(10) Patent No.: US 9,645,749 B2
(45) Date of Patent: May 9, 2017

(54) METHOD AND SYSTEM FOR RECHARACTERIZING THE STORAGE DENSITY OF A MEMORY DEVICE OR A PORTION THEREOF

(71) Applicant: SanDisk Enterprise IP LLC, Milpitas, CA (US)

(72) Inventors: Linh Tien Truong, San Jose, CA (US); Allen Samuels, San Jose, CA (US); Navneeth Kankani, Fremont, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 32 days.

(21) Appl. No.: 14/321,701

(22) Filed: Jul. 1, 2014

(65) Prior Publication Data

US 2015/0347039 A1 Dec. 3, 2015

Related U.S. Application Data

(60) Provisional application No. 62/005,908, filed on May 30, 2014.

(51) Int. Cl.
*G06F 3/06* (2006.01)
*G11C 11/56* (2006.01)
(Continued)

(52) U.S. Cl.
CPC .......... *G06F 3/0616* (2013.01); *G06F 3/0634* (2013.01); *G06F 3/0653* (2013.01);
(Continued)

(58) Field of Classification Search
CPC .... G06F 3/0616; G06F 3/0634; G06F 3/0653; G06F 3/0679; G11C 11/5621; G11C 13/0035; G11C 16/3495; G11C 2211/5641
See application file for complete search history.

(56) References Cited

U.S. PATENT DOCUMENTS 4,916,652 A 4/1990 Schwarz et al.
5,519,847 A 5/1996 Fandrich et al.
(Continued)

FOREIGN PATENT DOCUMENTS

EP 1 465 203 A1 10/2004
EP 1 990 921 A2 11/2008
(Continued)

OTHER PUBLICATIONS

International Search Report and Written Opinion dated Oct. 27, 2014 received in International Patent Application No. PCT/US2014/053868; which corresponds to U.S. Appl. No. 14/470,580, 8 pages. (Kruger).

(Continued)

*Primary Examiner* — Mark Giardino, Jr.
(74) *Attorney, Agent, or Firm* — Morgan, Lewis & Bockius LLP

(57) ABSTRACT

A storage system includes a memory controller and a storage device with one or more memory devices, each with a plurality of memory portions. The memory controller determines an initial storage capacity for each of the one or more memory devices, where the one or more memory devices are configured in a first storage density. The memory controller detects a trigger condition as to at least one memory portion of a respective device of the one or more memory devices and, in response to detecting the trigger condition, recharacterizes the at least one memory portion of the respective memory device so as to be configured in a second storage density, where the at least one recharacterized memory portion of the respective memory device has a reduced storage capacity. After the recharacterizing, the memory controller determines a revised storage capacity for the respective memory device.

18 Claims, 8 Drawing Sheets

(51) Int. Cl.
    *G11C 13/00*         (2006.01)
    *G11C 16/34*         (2006.01)
(52) U.S. Cl.
    CPC ........ *G06F 3/0679* (2013.01); *G11C 11/5621*
        (2013.01); *G11C 13/0035* (2013.01); *G11C
        16/3495* (2013.01); *G11C 2211/5641* (2013.01)

(56) References Cited

U.S. PATENT DOCUMENTS

| | | | |
|---|---|---|---|
| 5,524,231 A * | 6/1996 | Brown | G06F 12/06 |
| | | | 235/380 |
| 5,530,705 A | 6/1996 | Malone | |
| 5,537,555 A | 7/1996 | Landry | |
| 5,551,003 A | 8/1996 | Mattson et al. | |
| 5,657,332 A | 8/1997 | Auclair et al. | |
| 5,666,114 A | 9/1997 | Brodie et al. | |
| 5,708,849 A | 1/1998 | Coke et al. | |
| 5,943,692 A | 8/1999 | Marberg et al. | |
| 5,953,255 A | 9/1999 | Lee | |
| 5,982,664 A | 11/1999 | Watanabe | |
| 6,000,006 A | 12/1999 | Bruce et al. | |
| 6,016,560 A | 1/2000 | Wada et al. | |
| 6,018,304 A | 1/2000 | Bessios | |
| 6,070,074 A | 5/2000 | Perahia et al. | |
| 6,138,261 A | 10/2000 | Wilcoxson et al. | |
| 6,182,264 B1 | 1/2001 | Ott | |
| 6,192,092 B1 | 2/2001 | Dizon et al. | |
| 6,295,592 B1 | 9/2001 | Jeddeloh et al. | |
| 6,311,263 B1 | 10/2001 | Barlow et al. | |
| 6,442,076 B1 | 8/2002 | Roohparvar | |
| 6,449,625 B1 | 9/2002 | Wang | |
| 6,484,224 B1 | 11/2002 | Robins et al. | |
| 6,516,437 B1 | 2/2003 | Van Stralen et al. | |
| 6,678,788 B1 | 1/2004 | O'Connell | |
| 6,757,768 B1 | 6/2004 | Potter et al. | |
| 6,775,792 B2 | 8/2004 | Ulrich et al. | |
| 6,810,440 B2 | 10/2004 | Micalizzi, Jr. et al. | |
| 6,836,808 B2 | 12/2004 | Bunce et al. | |
| 6,836,815 B1 | 12/2004 | Purcell et al. | |
| 6,842,436 B2 | 1/2005 | Moeller | |
| 6,871,257 B2 | 3/2005 | Conley et al. | |
| 6,895,464 B2 | 5/2005 | Chow et al. | |
| 6,978,343 B1 | 12/2005 | Ichiriu | |
| 6,980,985 B1 | 12/2005 | Amer-Yahia et al. | |
| 6,981,205 B2 | 12/2005 | Fukushima et al. | |
| 6,988,171 B2 | 1/2006 | Beardsley et al. | |
| 7,020,017 B2 | 3/2006 | Chen et al. | |
| 7,032,123 B2 | 4/2006 | Kane et al. | |
| 7,043,505 B1 | 5/2006 | Teague et al. | |
| 7,100,002 B2 | 8/2006 | Shrader et al. | |
| 7,111,293 B1 | 9/2006 | Hersh et al. | |
| 7,162,678 B2 | 1/2007 | Saliba | |
| 7,173,852 B2 | 2/2007 | Gorobets et al. | |
| 7,184,446 B2 | 2/2007 | Rashid et al. | |
| 7,328,377 B1 | 2/2008 | Lewis et al. | |
| 7,516,292 B2 | 4/2009 | Kimura et al. | |
| 7,523,157 B2 | 4/2009 | Aguilar, Jr. et al. | |
| 7,527,466 B2 | 5/2009 | Simmons | |
| 7,529,466 B2 | 5/2009 | Takahashi | |
| 7,571,277 B2 | 8/2009 | Mizushima | |
| 7,574,554 B2 | 8/2009 | Tanaka et al. | |
| 7,596,643 B2 | 9/2009 | Merry et al. | |
| 7,609,561 B2 | 10/2009 | Cornwell et al. | |
| 7,681,106 B2 | 3/2010 | Jarrar et al. | |
| 7,685,494 B1 | 3/2010 | Varnica et al. | |
| 7,707,481 B2 | 4/2010 | Kirschner et al. | |
| 7,743,203 B2 | 6/2010 | France | |
| 7,761,655 B2 | 7/2010 | Mizushima et al. | |
| 7,761,678 B1 | 7/2010 | Bodmer et al. | |
| 7,774,390 B2 | 8/2010 | Shin | |
| 7,840,762 B2 | 11/2010 | Oh et al. | |
| 7,870,326 B2 | 1/2011 | Shin et al. | |
| 7,890,818 B2 | 2/2011 | Kong et al. | |
| 7,913,022 B1 | 3/2011 | Baxter | |
| 7,925,960 B2 | 4/2011 | Ho et al. | |
| 7,934,052 B2 | 4/2011 | Prins et al. | |
| 7,954,041 B2 | 5/2011 | Hong et al. | |
| 7,971,112 B2 | 6/2011 | Murata | |
| 7,974,368 B2 | 7/2011 | Shieh et al. | |
| 7,978,516 B2 | 7/2011 | Olbrich | |
| 7,996,642 B1 | 8/2011 | Smith | |
| 8,006,161 B2 | 8/2011 | Lestable et al. | |
| 8,032,724 B1 | 10/2011 | Smith | |
| 8,069,390 B2 | 11/2011 | Lin | |
| 8,190,967 B2 | 5/2012 | Hong et al. | |
| 8,254,181 B2 | 8/2012 | Hwang et al. | |
| 8,312,349 B2 | 11/2012 | Reche et al. | |
| 8,412,985 B1 | 4/2013 | Bowers et al. | |
| 8,711,665 B1 * | 4/2014 | Abdul Hamid | G11B 5/09 |
| | | | 369/44.32 |
| 8,898,548 B1 | 11/2014 | Mullendore et al. | |
| 9,292,440 B2 | 3/2016 | Shalvi et al. | |
| 2002/0024846 A1 | 2/2002 | Kawahara et al. | |
| 2002/0083299 A1 | 6/2002 | Van Huben et al. | |
| 2002/0152305 A1 | 10/2002 | Jackson et al. | |
| 2002/0162075 A1 | 10/2002 | Talagala et al. | |
| 2002/0165896 A1 | 11/2002 | Kim | |
| 2003/0041299 A1 | 2/2003 | Kanazawa et al. | |
| 2003/0043829 A1 | 3/2003 | Rashid | |
| 2003/0051090 A1 | 3/2003 | Bonnett et al. | |
| 2003/0088805 A1 | 5/2003 | Majni et al. | |
| 2003/0093628 A1 | 5/2003 | Matter et al. | |
| 2003/0188045 A1 | 10/2003 | Jacobson | |
| 2003/0189856 A1 | 10/2003 | Cho et al. | |
| 2003/0198100 A1 | 10/2003 | Matsushita et al. | |
| 2003/0212719 A1 | 11/2003 | Yasuda et al. | |
| 2004/0024957 A1 | 2/2004 | Lin et al. | |
| 2004/0024963 A1 | 2/2004 | Talagala et al. | |
| 2004/0073829 A1 | 4/2004 | Olarig | |
| 2004/0153902 A1 | 8/2004 | Machado et al. | |
| 2004/0181734 A1 | 9/2004 | Saliba | |
| 2004/0199714 A1 | 10/2004 | Estakhri et al. | |
| 2004/0237018 A1 | 11/2004 | Riley | |
| 2005/0060456 A1 | 3/2005 | Shrader et al. | |
| 2005/0060501 A1 | 3/2005 | Shrader | |
| 2005/0114587 A1 | 5/2005 | Chou et al. | |
| 2005/0172065 A1 | 8/2005 | Keays | |
| 2005/0172068 A1 * | 8/2005 | Sukegawa | G06F 12/0246 |
| | | | 711/103 |
| 2005/0172207 A1 | 8/2005 | Radke et al. | |
| 2005/0193161 A1 | 9/2005 | Lee et al. | |
| 2005/0201148 A1 | 9/2005 | Chen et al. | |
| 2005/0231765 A1 | 10/2005 | So et al. | |
| 2005/0257120 A1 | 11/2005 | Gorobets et al. | |
| 2005/0273560 A1 | 12/2005 | Hulbert et al. | |
| 2005/0289314 A1 | 12/2005 | Adusumilli et al. | |
| 2006/0039196 A1 | 2/2006 | Gorobets et al. | |
| 2006/0053246 A1 | 3/2006 | Lee | |
| 2006/0085671 A1 | 4/2006 | Majni et al. | |
| 2006/0136570 A1 | 6/2006 | Pandya | |
| 2006/0156177 A1 | 7/2006 | Kottapalli et al. | |
| 2006/0158933 A1 | 7/2006 | Ryu | |
| 2006/0195650 A1 | 8/2006 | Su et al. | |
| 2006/0259528 A1 | 11/2006 | Dussud et al. | |
| 2007/0011413 A1 | 1/2007 | Nonaka et al. | |
| 2007/0058446 A1 | 3/2007 | Hwang et al. | |
| 2007/0061597 A1 | 3/2007 | Holtzman et al. | |
| 2007/0076479 A1 | 4/2007 | Kim et al. | |
| 2007/0081408 A1 | 4/2007 | Kwon et al. | |
| 2007/0083697 A1 | 4/2007 | Birrell et al. | |
| 2007/0113019 A1 | 5/2007 | Beukema | |
| 2007/0133312 A1 | 6/2007 | Roohparvar | |
| 2007/0147113 A1 | 6/2007 | Mokhlesi et al. | |
| 2007/0150790 A1 | 6/2007 | Gross et al. | |
| 2007/0157064 A1 | 7/2007 | Falik et al. | |
| 2007/0174579 A1 | 7/2007 | Shin | |
| 2007/0180188 A1 | 8/2007 | Fujbayashi et al. | |
| 2007/0208901 A1 | 9/2007 | Purcell et al. | |
| 2007/0234143 A1 | 10/2007 | Kim | |
| 2007/0245061 A1 | 10/2007 | Harriman | |
| 2007/0277036 A1 | 11/2007 | Chamberlain et al. | |
| 2007/0291556 A1 | 12/2007 | Kamei | |
| 2007/0294496 A1 | 12/2007 | Goss et al. | |
| 2007/0300130 A1 | 12/2007 | Gorobets | |

(56) References Cited

U.S. PATENT DOCUMENTS

| | | |
|---|---|---|
| 2008/0019182 A1 | 1/2008 | Yanagidaira et al. |
| 2008/0022163 A1 | 1/2008 | Tanaka et al. |
| 2008/0052446 A1 | 2/2008 | Lasser et al. |
| 2008/0077841 A1 | 3/2008 | Gonzalez et al. |
| 2008/0077937 A1 | 3/2008 | Shin et al. |
| 2008/0086677 A1 | 4/2008 | Yang et al. |
| 2008/0112222 A1 | 5/2008 | Shirakawa |
| 2008/0144371 A1 | 6/2008 | Yeh et al. |
| 2008/0147964 A1 | 6/2008 | Chow et al. |
| 2008/0147998 A1 | 6/2008 | Jeong |
| 2008/0148124 A1 | 6/2008 | Zhang et al. |
| 2008/0159007 A1 | 7/2008 | Sekar et al. |
| 2008/0163030 A1 | 7/2008 | Lee |
| 2008/0163031 A1 | 7/2008 | Hsieh et al. |
| 2008/0168191 A1 | 7/2008 | Biran et al. |
| 2008/0168319 A1 | 7/2008 | Lee et al. |
| 2008/0170460 A1 | 7/2008 | Oh et al. |
| 2008/0229000 A1 | 9/2008 | Kim |
| 2008/0229003 A1 | 9/2008 | Mizushima et al. |
| 2008/0229176 A1 | 9/2008 | Arnez et al. |
| 2008/0235432 A1 | 9/2008 | Chen et al. |
| 2008/0270680 A1 | 10/2008 | Chang |
| 2008/0282128 A1 | 11/2008 | Lee et al. |
| 2008/0285351 A1 | 11/2008 | Shlick et al. |
| 2008/0320214 A1* | 12/2008 | Ma .................. G06F 3/0613 711/103 |
| 2009/0003058 A1 | 1/2009 | Kang |
| 2009/0037652 A1 | 2/2009 | Yu et al. |
| 2009/0046509 A1* | 2/2009 | Annavajjhala ...... G11C 11/5628 365/185.03 |
| 2009/0144598 A1 | 6/2009 | Yoon et al. |
| 2009/0168525 A1 | 7/2009 | Olbrich et al. |
| 2009/0172258 A1 | 7/2009 | Olbrich et al. |
| 2009/0172259 A1 | 7/2009 | Prins et al. |
| 2009/0172260 A1 | 7/2009 | Olbrich et al. |
| 2009/0172261 A1 | 7/2009 | Prins et al. |
| 2009/0172262 A1 | 7/2009 | Olbrich et al. |
| 2009/0172308 A1 | 7/2009 | Prins et al. |
| 2009/0172335 A1 | 7/2009 | Kulkarni et al. |
| 2009/0172499 A1 | 7/2009 | Olbrich et al. |
| 2009/0193058 A1 | 7/2009 | Reid |
| 2009/0207660 A1 | 8/2009 | Hwang et al. |
| 2009/0222708 A1 | 9/2009 | Yamaga |
| 2009/0228761 A1 | 9/2009 | Perlmutter et al. |
| 2009/0240873 A1 | 9/2009 | Yu et al. |
| 2009/0296466 A1 | 12/2009 | Kim et al. |
| 2009/0296486 A1 | 12/2009 | Kim et al. |
| 2009/0300269 A1 | 12/2009 | Radke et al. |
| 2009/0319720 A1 | 12/2009 | Stefanus et al. |
| 2009/0319864 A1 | 12/2009 | Shrader |
| 2010/0008140 A1 | 1/2010 | Lee |
| 2010/0017557 A1 | 1/2010 | Nakanishi et al. |
| 2010/0023682 A1 | 1/2010 | Lee et al. |
| 2010/0061151 A1 | 3/2010 | Miwa et al. |
| 2010/0103737 A1 | 4/2010 | Park |
| 2010/0161936 A1 | 6/2010 | Royer et al. |
| 2010/0199125 A1 | 8/2010 | Reche |
| 2010/0202196 A1 | 8/2010 | Lee et al. |
| 2010/0208521 A1 | 8/2010 | Kim et al. |
| 2010/0262889 A1 | 10/2010 | Bains |
| 2010/0281207 A1 | 11/2010 | Miller et al. |
| 2010/0281342 A1 | 11/2010 | Chang et al. |
| 2010/0306580 A1 | 12/2010 | McKean et al. |
| 2010/0332895 A1 | 12/2010 | Billing et al. |
| 2010/0332922 A1 | 12/2010 | Chang et al. |
| 2010/0332950 A1 | 12/2010 | Billing et al. |
| 2011/0083060 A1 | 4/2011 | Sakurada et al. |
| 2011/0099321 A1* | 4/2011 | Haines ............... G06F 12/0246 711/103 |
| 2011/0113281 A1 | 5/2011 | Zhang et al. |
| 2011/0131444 A1 | 6/2011 | Buch et al. |
| 2011/0173378 A1 | 7/2011 | Filor et al. |
| 2011/0199833 A1 | 8/2011 | Shim et al. |
| 2011/0205823 A1 | 8/2011 | Hemink et al. |
| 2011/0209031 A1 | 8/2011 | Kim et al. |
| 2011/0213920 A1 | 9/2011 | Frost et al. |
| 2011/0219259 A1 | 9/2011 | Frost et al. |
| 2011/0228601 A1 | 9/2011 | Olbrich et al. |
| 2011/0231600 A1 | 9/2011 | Tanaka et al. |
| 2011/0302477 A1 | 12/2011 | Goss et al. |
| 2012/0005451 A1 | 1/2012 | Lee et al. |
| 2012/0023285 A1* | 1/2012 | Kim .................. G06F 12/0246 711/103 |
| 2012/0096217 A1 | 4/2012 | Son et al. |
| 2012/0110250 A1 | 5/2012 | Sabbag et al. |
| 2012/0144110 A1 | 6/2012 | Smith |
| 2012/0151253 A1 | 6/2012 | Horn |
| 2012/0195126 A1 | 8/2012 | Roohparvar |
| 2012/0239976 A1 | 9/2012 | Cometti et al. |
| 2012/0240012 A1 | 9/2012 | Weathers et al. |
| 2012/0284587 A1 | 11/2012 | Yu et al. |
| 2012/0300527 A1 | 11/2012 | Shim et al. |
| 2013/0086454 A1 | 4/2013 | Rub |
| 2013/0138870 A1 | 5/2013 | Yoon et al. |
| 2013/0170297 A1 | 7/2013 | Nam et al. |
| 2013/0176784 A1 | 7/2013 | Cometti et al. |
| 2013/0242667 A1 | 9/2013 | Shim et al. |
| 2014/0006688 A1 | 1/2014 | Yu et al. |
| 2014/0122787 A1 | 5/2014 | Shakvi et al. |
| 2014/0136927 A1 | 5/2014 | Li et al. |
| 2014/0149641 A1 | 5/2014 | Avila et al. |
| 2014/0189421 A1 | 7/2014 | Werner et al. |
| 2014/0281126 A1 | 9/2014 | Bleyer et al. |
| 2014/0281152 A1 | 9/2014 | Karamcheti et al. |
| 2014/0351486 A1 | 11/2014 | Baryudin |
| 2014/0365719 A1 | 12/2014 | Kuzmin et al. |
| 2014/0379968 A1 | 12/2014 | Yao et al. |

FOREIGN PATENT DOCUMENTS

| | | |
|---|---|---|
| JP | 2002-532806 | 10/2002 |
| WO | WO 2007/036834 | 4/2007 |
| WO | WO 2007/080586 | 7/2007 |
| WO | WO 2008/121553 | 10/2008 |
| WO | WO 2008/121577 | 10/2008 |
| WO | WO 2009/028281 | 3/2009 |
| WO | WO 2009/032945 | 3/2009 |
| WO | WO 2009/058140 | 5/2009 |
| WO | WO 2009/084724 | 7/2009 |
| WO | WO 2009/134576 | 11/2009 |
| WO | WO 2011/031903 | 3/2011 |
| WO | WO 2012/174216 | 12/2012 |

OTHER PUBLICATIONS

International Search Report and Written Opinion dated Oct. 29, 2014 received in International Patent Application No. PCT/US2014/053879, which corresponds to U.S. Appl. No. 14/470,596, 8 pages (Kruger).

International Search Report and Written Opinion dated Nov. 6, 2014 received in International Patent Application No. PCT/US2014/053941, 8 pages (Samuels).

Kgil et al., "Improving NAND Flash Based Disk Cached", ISCA '08, 35th International Symposium on Computer Architecture, Jun. 21, 2008, 12 pages.

International Search Report and Written Opinion dated Jul. 23, 2015, received in International Patent Application No. PCT/US2015/030847, which corresponds to U.S. Appl. No. 14/321,701, 13 pages (Thuong).

International Search Repost and Written Opinion dated Jul. 23, 2015, received in International Patent Application No. PCT/US2015/030851 which corresponds to U.S. Appl. No. 14/298,841, 15 pages (Higgins).

International Search Report and Written Opinion dated Nov. 6, 2015, received in International Patent Application No. PCT/US2015/047892 which corresponds to U.S. Appl. No. 14/621,237, 9 pages (Samuels).

International Search Report and Written Opinion dated Nov. 6, 2015, received in International Patent Application No. PCT/US2015/04789 which corresponds to U.S. Appl. No. 14/621,253, 9 pages (Samuels).

(56) References Cited

OTHER PUBLICATIONS

International Search Report and Written Opinion dated Oct. 8, 2015, received in International Patent Application No. PCT/US2015/047898 which corresponds to U.S. Appl. No. 14/621,263, 9 pages (Samuels).
International Search Report and Written Opinion dated Nov. 6, 2015 received in International Patent Application No. PCT/US2015/047901, which corresponds to U.S. Appl. No. 14/621,212, 9 pages (Samuels).
International Search Report and Written Opinion dated Oct. 29, 2015 received in International Patent Application No. PCT/US2014/053941, which corresponds to U.S. Appl. No. 14/621,121, 9 pages (Samuels).
International Search Report and Written Opinion dated Nov. 6, 2015 received in International Patent Application No. PCT/US2014/047908, which corresponds to U.S. Appl. No. 14/621,148, 9 pages (Samuels).
Barr, "Introduction to Watchdog Timers," Oct. 2001, 3 pgs.
Canim, "Buffered Bloom Filters on Solid State Storage," ADMS*10, Singapore, Sep. 13-17, 2010, 8 pgs.
Kang, "A Multi-Channel Architecture for High-Performance NAND Flash-Based Storage System," J. Syst. Archit., vol. 53, Issue 9, Sep. 2007, 15 pgs.
Kim, "A Space-Efficient Flash Translation Layer for CompactFlash Systems,"May 2002, IEEE vol. 48, No. 2, 10 pgs.
Lu, "A Forest-structured Bloom Filter with Flash Memory," MSST2011, Denver, CO, May 23-27, 2011, article, 6 pgs.
Lu, "A Forest-structured Bloom Filter with Flash Memory," MSST 2011, Denver, CO, May 23-27, 2011, presentation slides, 25 pgs.
McLean, "Information Technology—AT Attachment with Packet Interface Extension," Aug. 19, 1998, 339 pgs.
Microchip Technology, "Section 10, Watchdog Timer and Power-Saving Modes," 2005, 14 pages.
Park et al., "A High Performance Controller for NAND Flash-Based Solid State Disk (NSSD)," Proceedings of Non-Volatile Semiconductor Memory Workshop, Feb. 2006, 4 pgs.
Zeidman, "Verilog Designer's Library," 1999, 9 pgs.
International Search Report and Written Opinion, dated Mar. 19, 2009 received in International Patent Application No. PCT/US08/88133, which corresponds to U.S. Appl. No. 12/082,202, 72 pgs (Prins).
International Search Report and Written Opinion, dated Mar. 19, 2009, received in International Patent Application No. PCT/US08/88136, which corresponds to U.S. Appl. No. 12/082,205, 7 pgs (Olbrich).
International Search Report and Written Opinion dated Feb. 26, 2009, received in International Patent Application No. PCT/US08/88146, which corresponds to U.S. Appl. No. 12/082,221, 10 pgs (Prins).
International Search Report and Written Opinion dated Feb. 27, 2009, received in International Patent Application No. PCT/US2008/088154, which corresponds to U.S. Appl. No. 12/082,207, 8 pgs (Prins).
International Search Report and Written Opinion dated Feb. 13, 2009, received in International Patent Application No. PCT/US08/88164, which corresponds to U.S. Appl. No. 12/082,220, 6 pgs (Olbrich).
International Search Report and Written Opinion dated Feb. 18, 2009, received in International Patent Application No. PCT/US08/88206, which corresponds to U.S. Appl. No. 12/082,206, 8 pgs (Prins).
International Search Report and Written Opinion dated Feb. 19, 2009, received in International Patent Application No. PCT/US08/88217, which corresponds to U.S. Appl. No. 12/082,204, 7 pgs. (Olbrich).
International Search Report and Written Opinion dated Feb. 13, 2009, received in International Patent Application No. PCT/US08/88229, which corresponds to U.S. Appl. No. 12/082,223, 7 pgs. (Olbrich).
International Search Report and Written Opinion dated Feb. 19, 2009, received in International Patent Application No. PCT/US08/88232, which corresponds to U.S. Appl. No. 12/082,222, 8 pgs (Olbrich).
International Search Report and Written Opinion dated Feb. 19, 2009, received in International Patent Application No. PCT/US08/88236, which corresponds to U.S. Appl. No. 12/082,203, 7 pgs. (Olbrich).
International Search Report and Written Opinion dated Oct. 27, 2011, received in International Patent Application No. PCT/US2011/028637, which corresponds to U.S. Appl. No. 12/726,200, 11 pgs (Olbrich).
European Search Report dated Feb. 23. 2012, received in European Patent Applicaton No. 08868997.3, which corresponds to U.S. Appl. No. 12/082,207, 6 pgs (Prins).
Office Action dated Apr. 18, 2012, received in Chinese Patent Application No. 200880127623.8, which corresponds to U.S. Appl. No. 12/082,207, 12 pgs (Prins).
Office Action dated Dec. 31, 2012, received in Chinese Patent Application No. 200880127623.8, which corresponds to U.S. Appl. No. 12/082,207, 9 pgs (Prins).
Notification of the Decision to Grant a Patent Right for Patent for Invention dated Jul. 4, 2013, received in Chinese Patent Application No. 200880127623.8, which corresponds to U.S. Appl. No. 12/082,207, 1 pg (Prins).
Office Action dated Jul. 24, 2012, received in Japanese Patent Application No. JP 2010-540863, 3 pgs (Prins).
International Search Report and Written Opinion dated Mar. 7, 2014, received in International Patent Application No. PCT/US2013/074772, which corresponds to U.S. Appl. No. 13/831,218, 10 pages (George).
International Search Report and Written Opinion dated Mar. 24, 2014, received in International Patent Application No. PCT/US2013/074777, which corresponds to U.S. Appl. No. 13/831,308, 10 pages (George).
International Search Report and Written Opinion dated Mar. 7, 2014, received in International Patent Application No. PCT/US2013/074779, which corresponds to U.S. Appl. No. 13/831,374, 8 pages (George).
International Search Report and Written Opinion dated Aug. 31, 2012, received in International Patent Application PCT/US2012/042764, which corresponds to U.S. Appl. No. 13/285,873, 12 pgs (Frayer).
International Search Report and Written Opinion dated Mar. 4, 2013, received in PCT/US2012/042771, which corresponds to U.S. Appl. No. 13/286,012, 14 pgs (Stonelake).
International Search Report and Written Opinion dated Sep. 26, 2012, received in International Patent Application No. PCT/US2012/042775, which corresponds to U.S. Appl. No. 13/285,892, 8 pgs (Weston-Lewis et al.)
International Search Report and Written Opinion dated Jun. 6, 2013, received in International Patent Application No. PCT/US2012/059447, which corresponds to U.S. Appl. No. 13/602,031, 12 pgs (Tai).
International Search Report and Written Opinion dated Jun. 6, 2013, received in International Patent Application No. PCT/US2012/059453, which corresponds to U.S. Appl. No. 13/602,039, 12 pgs (Frayer).
International Search Report and Written Opinion dated Feb. 14, 2013, received in International Patent Application No. PCT/US2012/059459, which corresponds to U.S. Appl. No. 13/602,047, 9 pgs. (Tai).
International Search Report and Written Opinion dated May 23, 2013, received in International Patent Application No. PCT/US2012/065914, which corresponds to U.S. Appl. No. 13/679,963, 7 pgs (Frayer).
International Search Report and Written Opinion dated Apr. 5, 2013, received in International Patent Application No. PCT/US2012/065916, which corresponds to U.S. Appl. No. 13/679,969, 7 pgs (Frayer).

(56) References Cited

OTHER PUBLICATIONS

International Search Report and Written Opinion dated Jun. 17, 2013, received in International Patent Application No. PCT/US2012/065919, which corresponds to U.S. Appl. No. 13/679,970, 8 pgs (Frayer).

International Search Report and Written Opinion dated Oct. 29, 2015 received in International Patent Application No. PCT/US2015/047904, which corresponds to U.S. Appl. No. 14/621,121, 9 pages (Samuels).

International Preliminary Report on Patentability dated Dec. 6, 2016, received in International Patent Application No. PCT/US2015/030847, which corresponds to U.S. Appl. No. 14/321,701, 9 pages (Truong).

International Preliminary Report on Patentability dated Dec. 6, 2016, received in International Patent Application No. PCT/US2015/030851, which corresponds to U.S. Appl. No. 14/298,841, 10 pages (Higgins).

\* cited by examiner

METHOD AND SYSTEM FOR RECHARACTERIZING THE STORAGE DENSITY OF A MEMORY DEVICE OR A PORTION THEREOF

RELATED APPLICATIONS

This application claims priority to U.S. Provisional Patent Application No. 62/005,908, filed May 30, 2014, which is hereby incorporated by reference.

This application is related to U.S. patent application Ser. No. 14/298,841, filed Jun. 6, 2014, entitled "Method and System for Dynamic Word Line Based Configuration of a Three-Dimensional Memory Device," which is incorporated herein by reference in its entirety.

TECHNICAL FIELD

The disclosed embodiments relate generally to memory systems, and in particular, to improving the reliability with which a storage device (e.g., a flash memory device) retains data.

BACKGROUND

Non-volatile data storage devices have enabled increased portability of data and software applications. For example, storage elements of a flash memory device may each store multiple bits of data, enhancing data storage density as compared to single-level cell (SLC) flash memory devices. Consequently, flash memory devices enable users to store and access a large amount of data. However, as a number of bits stored per cell increases, bit errors in stored data typically increase, and in addition, MLC memory cells typically wear faster than SLC memory cells. Furthermore, when a flash memory device reaches end-of-life conditions, the memory device is typically retired or removed from a storage system.

SUMMARY

In some embodiments, a memory controller is configured to perform operations with/on a storage device (e.g., a flash memory device). In some embodiments, the memory controller recharacterizes at least a portion of a memory device from a first storage density to a second storage density after detecting a trigger condition so as to maximize the life of the portion of the memory device, and the memory device itself, past end-of-life conditions for the first storage density.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

Figure 1:
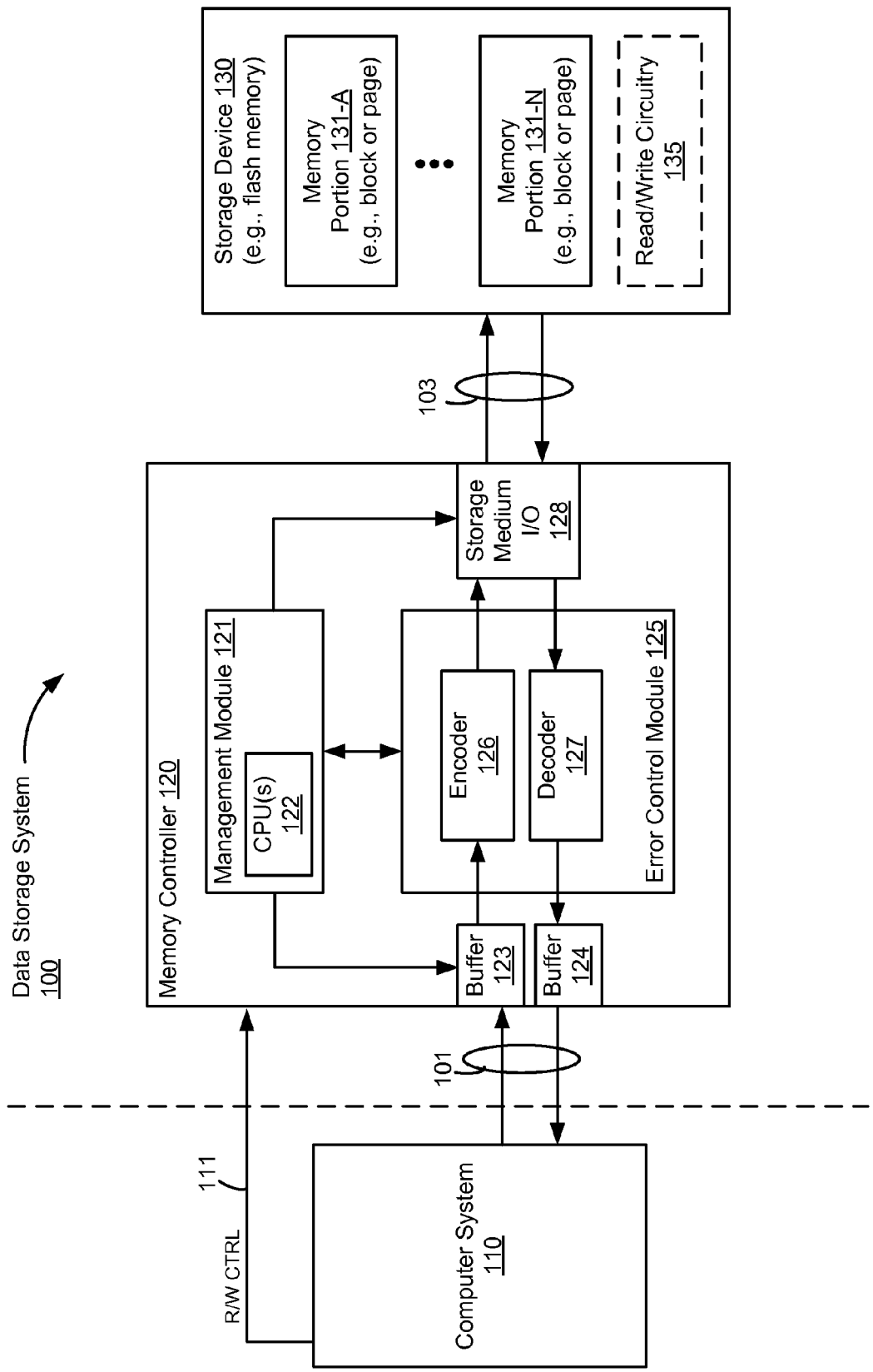
FIG. 1 is a block diagram of an implementation of a data storage system in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

Sometimes herein, a memory cell configured to store 1 bit is referred to as an X1 memory cell, a memory cell configured to store 2 bits is referred to as a X2 memory cell, and a memory cell configured to store 3 bits is referred to as an X3 memory cell. Additionally, a retired memory cell, which is not available for further programming, is referred to as an X0 memory cell. Furthermore, sometimes X3, X2, and X1 are used to indicate levels of storage density: X3 (three bits per memory cell), X2 (two bits per memory cell) and X1 (one bit per memory cell).

The various implementations described herein include systems, devices, and/or methods that may improve the reliability with which data can be retained by a storage device (e.g., a flash memory device). Some implementations include systems, devices, and/or methods to recharacterization at least a portion of a memory device from a first storage density to a second storage density (e.g., from X2 to X1) so as to maximize the life of the portion of the memory device and the memory device itself. In some implementations, the memory cells of a memory device, or a portion of the memory device, are recharacterized from X2 to X1 after reaching end-of-life conditions while the memory cells are operating as X2 memory cells, so as to extend the operating life of the memory device.

In some embodiments, a method of operation in a storage system that includes a memory controller and a storage device with one or more memory devices is performed by the memory controller (e.g., embedded in the storage device or separate from the storage device). In some embodiments, a respective memory device of the one or more memory devices includes a plurality of memory portions (e.g., die, block, or pages portions). The method includes determining an initial storage capacity for each of the one or more memory devices, where the one or more memory devices are configured in a first storage density. The method includes: detecting a trigger condition as to at least one memory portion of a respective device of the one or more memory devices; and, in response to detecting the trigger condition, recharacterizing the at least one memory portion of the respective memory device so as to be configured in a second storage density, where the at least one recharacterized memory portion of the respective memory device has a reduced storage capacity. After the recharacterizing, the method includes determining a revised storage capacity for the respective memory device.

Some embodiments include an electronic system or device (e.g., data storage system 100, FIG. 1 or memory controller 120, FIG. 1), comprising: one or more processors; and memory storing one or more programs to be executed by the one or more processors, the one or more programs comprising instructions for performing or controlling performance of any of the methods described herein. Some embodiments include a non-transitory computer readable storage medium, storing one or more programs for execution by one or more processors of an electronic system or device (e.g., data storage system 100, FIG. 1 or memory controller 120, FIG. 1), the one or more programs including instructions for performing or controlling performance of any of the methods described herein. Some embodiments include an electronic system or device (e.g., data storage system 100, FIG. 1 or memory controller 120, FIG. 1) comprising means for performing or controlling performance of the operations of any of the methods described herein.

Numerous details are described herein in order to provide a thorough understanding of the example implementations illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the implementations described herein.

FIG. 1 is a diagram of an implementation of a data storage system 100 in accordance with some embodiments. While some example features are illustrated, various other features have not been illustrated for the sake of brevity and so as not to obscure more pertinent aspects of the example embodiments disclosed herein. To that end, as a non-limiting example, data storage system 100 is used in conjunction with a computer system 110, where data storage system 100 includes a memory controller 120 and a storage device 130. In some embodiments, storage device 130 includes a single memory device (e.g., a volatile memory device or a non-volatile memory (NVM) device such as a magnetic disk storage device, an optical disk storage device, a flash memory device, a three-dimensional (3D) memory device (as further described herein), or another semiconductor NVM memory device). In some embodiments, storage device 130 includes a plurality of memory devices or is one of a plurality of memory devices coupled with memory controller 120. In some embodiments, a memory device includes one or more die, each with two or more individually addressable blocks (e.g., erase blocks). In some embodiments, storage device 130 includes NAND-type flash memory or NOR-type flash memory. Further, in some embodiments, memory controller 120 is a solid-state drive (SSD) controller. However, one or more other types of storage media may be included in accordance with aspects of a wide variety of embodiments.

Computer system 110 is coupled with memory controller 120 through data connections 101. However, in some embodiments, computer system 110 includes memory controller 120 as a component and/or a sub-system. Computer system 110 may be any suitable computing device, such as a desktop computer, a laptop computer, a tablet device, a netbook, an internet kiosk, a personal digital assistant, a mobile phone, a smart phone, a gaming device, a wearable computing device, a computer server, or any other computing device. Computer system 110 is sometimes called a host or host system. In some embodiments, computer system 110 includes one or more processors, one or more types of memory, a display, and/or other user interface components such as a keyboard, a touch screen display, a mouse, a track-pad, a digital camera, and/or any number of supplemental devices to add I/O functionality.

Storage device 130 is coupled with memory controller 120 through connections 103. Connections 103 are sometimes called data connections, but typically convey commands in addition to data, and optionally convey metadata, error correction information, and/or other information in addition to data values to be stored in storage device 130 and data values read from storage device 130. In some embodiments, however, memory controller 120 and storage device 130 are included in the same device as components thereof. Furthermore, in some implementations memory controller 120 and storage device 130 are embedded in a host device, such as a mobile device, tablet, other computer, or computer controlled device, and the methods described herein are performed by the embedded memory controller. Storage device 130 may include any number (i.e., one or more) of memory devices including, without limitation, non-volatile semiconductor memory devices, such as flash memory. For example, flash memory devices can be configured for enterprise storage suitable for applications such as cloud computing, or for caching data stored (or to be stored) in secondary storage, such as hard disk drives. Additionally and/or alternatively, flash memory can also be configured for relatively smaller-scale applications such as personal flash drives or hard-disk replacements for personal, laptop and tablet computers.

In FIG. 1, storage device 130 (e.g., with one or more memory devices) includes a plurality of memory portions 131-A, . . . , 131-N. For example, a respective memory portion is one of a plurality of memory devices in storage device 130, or a die, block (e.g., an individually addressable block, such as an erase block), word line, or page associated with a respective memory device in storage device 130. In another example, a respective memory portion is a set of memory units (e.g., erase blocks, such as one per die) in multiple die.

In some embodiments, storage device 130 is divided into a number of individually addressable (and thus individually selectable) blocks. In some embodiments, the individually selectable blocks are the minimum size erasable units in a flash memory device. In other words, each block contains the minimum number of memory cells that can be erased simultaneously. Each block is usually further divided into a plurality of pages and/or word lines, where each page or word line is typically an instance of the smallest individually accessible (readable) portion in a block. In some embodiments (e.g., using some types of flash memory), the smallest individually accessible unit of a data set, however, is a sector, which is a subunit of a page. That is, a block includes a plurality of pages, each page contains a plurality of sectors, and each sector is the minimum unit of data for reading data from the flash memory device. In some embodiments, storage device 130 includes read/write circuitry 135 for selecting a respective portion of storage device 130 on which to perform a memory operation (e.g., a read, write, or erase operation) and for causing performance of the memory operation on the respective portion of storage device 130.

For example, one block includes a number of pages (e.g., 64 pages, 128 pages, 256 pages, or another suitable number of pages). In some implementations, the blocks in a die are grouped into a plurality of zones. Typically, each block zone of the die is in a physically distinct region of the die such as a particular half or particular quadrant of the memory cell array in the die. In some implementations, each block zone is independently managed to some extent, which increases the degree of parallelism for parallel operations and simplifies management of storage device 130.

In some embodiments, memory controller 120 includes a management module 121, an input buffer 123, an output buffer 124, an error control module 125, and a storage medium interface (I/O) 128. In some embodiments, memory controller 120 includes various additional features that have not been illustrated for the sake of brevity and so as not to obscure more pertinent features of the example embodiments disclosed herein, and that a different arrangement of features may be possible. Input buffer 123 and output buffer 124 provide an interface to computer system 110 through data connections 101. Similarly, storage medium I/O 128 provides an interface to storage device 130 though connections 103. In some embodiments, storage medium I/O 128 includes read/write circuitry capable of providing reading signals to storage device 130. For example, the reading signals specify reading threshold voltages for NAND-type flash memory.

In some embodiments, management module 121 includes one or more processing units (CPU(s), also sometimes called one or more processors) 122 configured to execute instructions in one or more programs (e.g., in management module 121). In some embodiments, one or more CPUs 122 are shared by one or more components within, and in some cases, beyond the function of memory controller 120. Management module 121 is coupled with input buffer 123, output buffer 124 (connection not shown), error control module 125, and storage medium I/O 128 in order to coordinate the operation of these components.

Error control module 125 is coupled with storage medium I/O 128, input buffer 123 and output buffer 124. Error control module 125 is provided to limit the number of uncorrectable errors inadvertently introduced into data. In some embodiments, error control module 125 is executed in software by one or more CPUs 122 of management module 121, and, in other embodiments, error control module 125 is implemented in whole or in part using special purpose circuitry to perform encoding and decoding functions associated with error correction. To that end, error control module 125 includes an encoder 126 and a decoder 127. In some embodiments, error control module 125 is configured to encode data (i.e., with encoder 126) and decode raw read data (i.e., with decoder 127) according to one of a plurality of error control code (ECC) techniques, or ECC strengths, such as Reed-Solomon (RS), turbo-code, Bose-Chaudhuri-Hocquenghem (BCH), low-density parity check (LDPC), or other error control codes, or a combination thereof.

Those skilled in the art will appreciate that various error control codes have different error detection and correction capacities, and that particular codes are selected for various applications for reasons beyond the scope of this disclosure. As such, an exhaustive review of the various types of error control codes is not provided herein. Moreover, those skilled in the art will appreciate that each type or family of error control codes may have encoding and decoding algorithms that are particular to the type or family of error control codes. On the other hand, some algorithms may be utilized at least to some extent in the decoding of a number of different types or families of error control codes. As such, for the sake of brevity, an exhaustive description of the various types of encoding and decoding algorithms generally available and known to those skilled in the art is not provided herein.

During a write operation, input buffer 123 receives data to be stored in storage device 130 from computer system 110 (e.g., write data). The data held in input buffer 123 is made available to encoder 126, which encodes the data by applying an error control code to produce one or more codewords. The one or more codewords are made available to storage medium I/O 128, which transfers the one or more codewords to storage device 130 in a manner dependent on the type of storage medium being utilized.

A read operation is typically initiated when computer system (host) 110 sends one or more host read commands on control line 111 to memory controller 120 requesting data from storage device 130. Memory controller 120 sends one or more read access commands to storage device 130, via storage medium I/O 128, to obtain raw read data, typically in accordance with memory locations (addresses) specified by the one or more host read commands. Storage medium I/O 128 provides the raw read data (e.g., comprising one or more codewords) to decoder 127. Decoder 127 applies a decoding process to the encoded data to recover the data, and to correct errors in the recovered data within the error correcting capability of the error control code. If the decoding is successful, the decoded data is provided to output buffer 124, where the decoded data is made available to computer system 110. Optionally, decoder 127 provides an indication of a number of corrected bits. In some embodiments, if the decoding is not successful, memory controller 120 may resort to a number of remedial actions or provide an indication of an irresolvable error condition.

Flash memory devices utilize memory cells to store data as electrical values, such as electrical charges or voltages. Each flash memory cell typically includes a single transistor with a floating gate that is used to store a charge, which modifies the threshold voltage of the transistor (i.e., the voltage needed to turn the transistor on). The magnitude of the charge, and the corresponding threshold voltage the charge creates, is used to represent one or more data values. In some implementations, during a read operation, a reading threshold voltage is applied to the control gate of the transistor and the resulting sensed current or voltage is mapped to a data value.

The terms "cell voltage" and "memory cell voltage," in the context of flash memory cells, means the threshold voltage of the memory cell, which is the minimum voltage that needs to be applied to the gate of the memory cell's transistor in order for the transistor to conduct current. Similarly, reading threshold voltages (sometimes also called reading signals and reading voltages) applied to a flash memory cells are gate voltages applied to the gates of the flash memory cells to determine whether the memory cells conduct current at that gate voltage. In some implementations, when a flash memory cell's transistor conducts current at a given reading threshold voltage, indicating that the cell voltage is less than the reading threshold voltage, the raw data value for that read operation is a "1" and otherwise the raw data value is a "0."

Figure 2A:
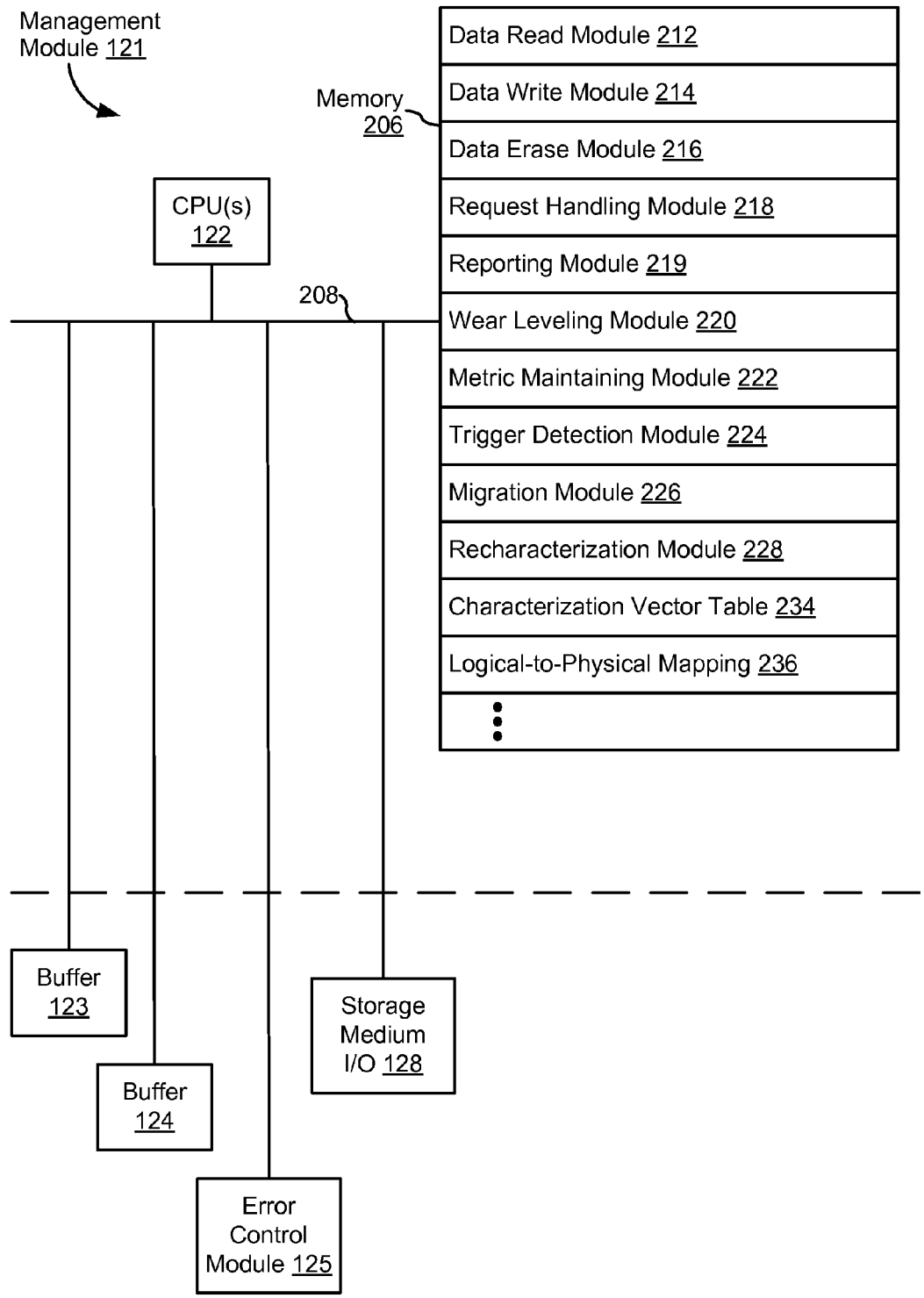
FIG. 2A is a block diagram of an implementation of a management module in accordance with some embodiments.

FIG. 2A is a block diagram illustrating an exemplary management module 121, in accordance with some embodiments. Management module 121 typically includes one or more processing units 122 (also sometimes called CPU(s), processing unit(s), microprocessor(s), microcontroller(s), or core(s)) for executing modules, programs and/or instructions stored in memory 206 and thereby performing processing operations, memory 206, and one or more communication buses 208 for interconnecting these components. Communication buses 208 optionally include circuitry (sometimes called a chipset) that interconnects and controls communications between system components. Management module 121 is coupled with buffer 123, buffer 124, error control module 125, and storage device 130 by communication buses 208. Memory 206 includes volatile memory (e.g., one or more high-speed random access memory devices such as DRAM, SRAM, DDR RAM, or other random access solid state memory devices), and/or non-volatile memory (e.g., one or more NVM devices such as magnetic disk storage device(s), optical disk storage device(s), flash memory device(s), 3D memory device(s), or other non-volatile solid state storage device(s)). Memory 206 optionally includes one or more storage devices remotely located from one or more processing units 122. Memory 206, or alternately the non-volatile memory device(s) within memory 206, comprises a non-transitory computer readable storage medium. In some embodiments, memory 206, or the computer readable storage medium of memory 206 stores the following programs, modules, and data structures, or a subset or superset thereof:

- data read module 212 for reading data, or causing data to be read, from storage device 130;
- data write module 214 for writing data, or causing data to be written, to storage device 130;
- data erase module 216 for erasing data, or causing data to be erased, from storage device 130;
- request handling module 218 for receiving queries and commands from the host (e.g., computer system 110, FIG. 1) and/or queries and commands from other internal processes;
- reporting module 219 for reporting, to the host (e.g., computer system 100, FIG. 1), the storage capacity and/or status metric(s) associated with a respective portion of storage device 130;
- wear leveling module 220 for optimally determining pages or blocks of storage device 130 for storing data so as to evenly wear the pages or blocks of storage device 130;
- metric maintaining module 222 for maintaining one or more status metrics for each memory portion of the plurality of memory portions of storage device 130 (e.g., a memory device, die, block, word line, or page portion) or a combined status metric for each memory portion of storage device 130, where the combined status metric for a respective memory portion is computed based on a predefined algorithm that includes the one or more status metrics corresponding to the respective memory portion;
- trigger detection module 224 for detecting a trigger condition as to a respective portion of storage device 130;
- migration module 226 for optionally migrating data stored in the respective portion of storage device 130 (e.g., to another portion storage device 130 such as a different memory device or block associated with data storage system 100)
- recharacterization module 228 for recharacterizing the storage density of the respective portion of storage device 130 in response to detecting the trigger condition as to the respective portion of storage device 130;
- characterization vector table 234 storing a collection of characterization vectors 235 (FIG. 2B) that store characterization data for respective portions of storage device 130; and
- logical-to-physical mapping 236 storing a logical-to-physical map which maps logical addresses recognized by the host (e.g., computer system 110, FIG. 1) to physical addresses of storage device 130.

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise rearranged in various embodiments. In some embodiments, memory 206 may store a subset of the modules and data structures identified above. Furthermore, memory 206 may store additional modules and data structures not described above. In some embodiments, the programs, modules, and data structures stored in memory 206, or the computer readable storage medium of memory 206, provide instructions for implementing any of the methods described below with reference to FIGS. 5A-5C. In some embodiments, the above identified modules may be implemented in hardware, firmware, software, or a combination thereof. Further, one or more of the above identified modules may be implemented in whole or in part in hardware, for example, using one or more state machines.

Although FIG. 2A shows a management module 121, FIG. 2A is intended more as functional description of the various features which may be present in a management module than as a structural schematic of the embodiments described herein. In practice, and as recognized by those of ordinary skill in the art, items shown separately could be combined and some items could be separated.

Figure 2B:
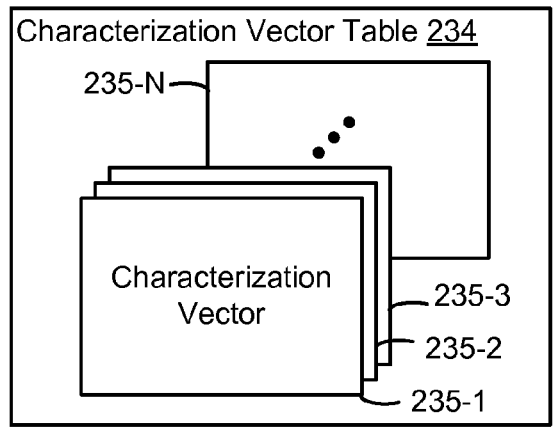
FIG. 2B is a diagram of a characterization vector table included in FIG. 2A in accordance with some embodiments.
Figure 2C:
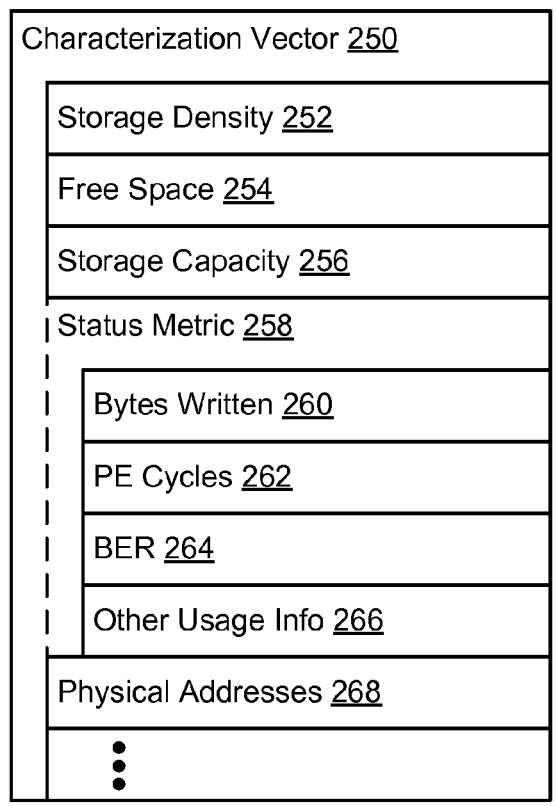
FIG. 2C is a diagram of a representative characterization vector included in FIG. 2B in accordance with some embodiments.

FIG. 2B is a block diagram illustrating an implementation of a characterization vector table 234 in accordance with some embodiments. Characterization vector table 234 includes a collection of characterization vectors 235, optionally implemented as a collection of tuples for efficient storage, that each store characterization data associated with a respective portion of storage device 130 (e.g., a distinct memory device, die, block zone, block, word line, word line zone, or page portion of storage device 130). In some embodiments, each vector (e.g., vector 235-1, vector 235-2, . . . , vector 235-N) in the collection of characterization vectors 235 stores characterization data (e.g., as shown in FIG. 2C, bytes written 260, PE cycles 262, bit error rate (BER) 264, and/or other usage information 266) derived during each of at least two time periods for a respective portion of storage device 130. In some implementations, the characterization data stored in characterization vectors 235 is statistically derived.

For example, without limitation, in some embodiments in which storage device 130 (FIG. 1) includes multiple memory devices, characterization vector table 234 includes at least one characterization vector for each distinct memory device of storage device 130. In another example, without limitation, in some embodiments in which storage device 130 (FIG. 1) includes multiple blocks, characterization vector table 234 includes at least one characterization vector for each distinct block of storage device 130. In another example, in some embodiments, characterization vector table 234 includes a set of distinct characterization vectors 235 for each block of storage device 130, and the set of distinct characterization vectors 235 for each die includes at least one distinct characterization vector for each word line or page in the block. More detailed example implementations of characterization vectors 235 are described below with reference to FIG. 2C.

FIG. 2C is a schematic diagram of an implementation of a representative characterization vector 250 (e.g., corresponding to any one of characterization vectors 235 shown in FIG. 2B) in accordance with some embodiments. In some embodiments, for a respective portion of storage device 130, characterization data stored in characterization vector 250 includes: (i) a storage density field 252 indicating the current storage density of memory cells in the respective portion of storage device 130 such as X3 (i.e., 3 bits per memory cell), X2 (i.e., 2 bits per memory cell), X1 (i.e., SLC or 1 bit per memory cell), or X0 (i.e., retired memory cells); (ii) a free space field 254 indicating the amount of free space available in the respective portion of storage device 130; and (iii) a storage capacity field 256 indicating the advertised capacity to the host (e.g., computer system 110, FIG. 1) or the total capacity of the respective portion of storage device 130.

In some embodiments, characterization data stored in characterization vector 250 for the respective portion of storage device 130 also includes one or more status metrics 258, non-limiting example of which include: (a) a bytes written field 260 indicating a number of bytes of data written to the respective portion of storage device 130; (b) a PE cycle field 262 indicating a current count of the number of PE cycles performed on the respective portion of storage device 130; (c) a bit error rate (BER) field 264 indicating a number of errors included in a codeword read from a page of the respective portion of storage device 130 or an average number of errors included in the previous N codewords read from page(s) of the respective portion of storage device 130; and (d) other usage information 266 indicating the health, performance, and/or endurance of the respective portion of storage device 130.

In some embodiments, characterization data stored in characterization vector 250 optionally includes a combined status metric (represented by status metric 258 in FIG. 2C) for the respective portion of storage device 130. In some embodiments, the combined status metric is associated with the output of a predefined algorithm (e.g., computed by metric maintaining module 222, FIG. 2A) that takes into account one or more usage parameters associated with the respective portion of storage device 130. For example, the predefined algorithm incorporates one or more of: (a) a number of bytes written to the respective portion of storage device 130; (b) a number of PE cycles performed on the respective portion of storage device 130; (c) a BER for codewords read from the respective portion of storage device 130; and (d) other usage information associated with the respective portion of storage device 130 (e.g., temperature, operating conditions, etc.).

In some embodiments, characterization data stored in characterization vector 250 includes a physical addresses field 268 for the respective portion of storage device 130 that indicates the physical addresses or set of physical addresses corresponding to the respective portion of storage device 130. In some embodiments, characterization data stored in characterization vector 250 for the respective portion of storage device 130 further includes an ECC technique (e.g., RS, BCH, or LDPC) and/or ECC strength (e.g., a strength parameter that indicates or corresponds to the number of parity bits included in each codeword) for encoding data to be written to the respective portion of storage device 130 and decoding data read from the respective portion of storage device 130. In some embodiments, characterization data stored in characterization vector 250 for the respective portion of storage device 130 further includes read/write parameters (e.g., a programming voltage, number of programming pulses, duration/width/step of programming pulses, and reading threshold voltages for reading different states of memory cells in the respective portion of storage device 130) indicating parameters for writing data to and reading data from the respective portion of storage device 130.

As indicated above, X3, X2, and X1 are sometimes used to indicate levels of storage density for memory cells: X3 (three bits per memory cell), X2 (two bits per memory cell), and X1 (one bit per memory cell).

Figure 3:
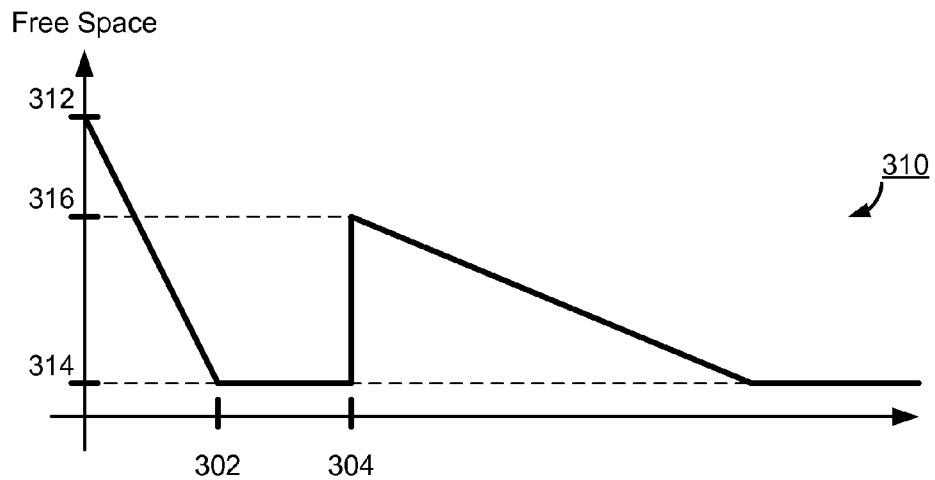
FIG. 3 is a diagram of a first implementation of a recharacterization process in accordance with some embodiments.
Figure 3:
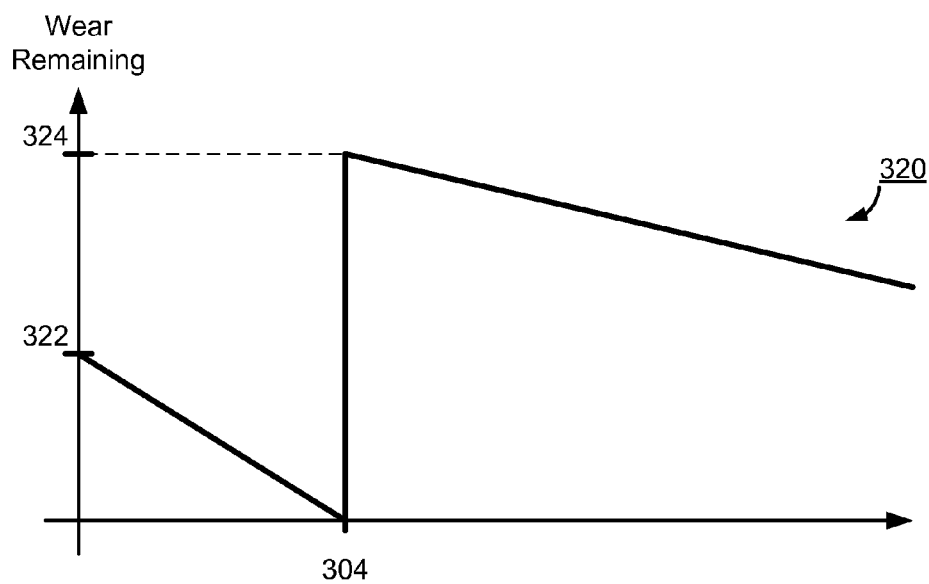
Figure 3:
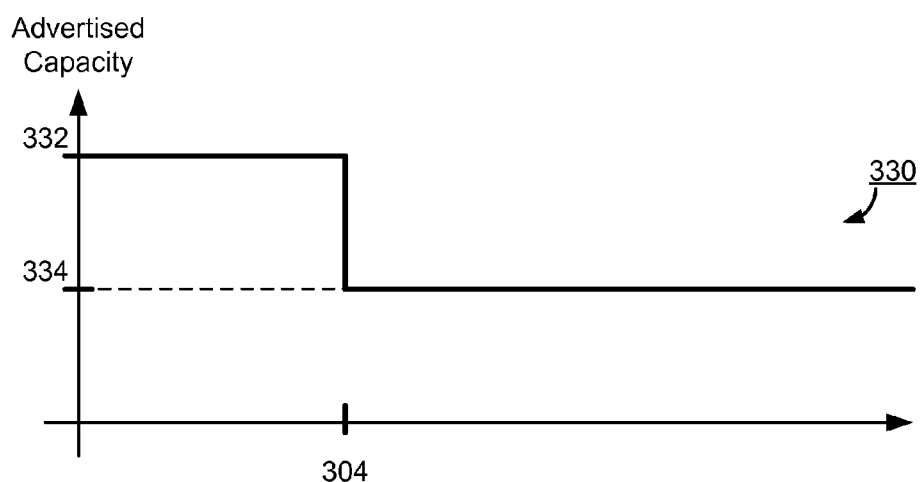

FIG. 3 illustrates a first implementation of a recharacterization process 300 in accordance with some embodiments. In one example, recharacterization process 300 is performed on a respective memory device associated with storage device 130 by memory controller 120. In another example, recharacterization process 300 is performed on a portion of a respective memory device associated with storage device 130 (e.g., a die, a block (sometimes called an erase block), or a group or blocks) by memory controller 120. Recharacterization process 300 will be discussed with reference to a respective memory device for ease of discussion; however, one of skill in the art will appreciate how to apply the concepts discussed to a recharacterization process performed on a portion of the respective memory device such as a die, block or group of blocks of the respective memory device.

In FIG. 3, prior to time 304 (i.e., the time identified by time 304), the respective memory device is configured in a first storage density (e.g., X3 or X2). In FIG. 3, at or before time 304, memory controller 120 or a component thereof (e.g., trigger detection module 224, FIG. 2A) detects a trigger condition as to the respective memory device. In some embodiments, trigger detection module 224 detects the trigger condition as to the respective memory device when the amount of wear remaining for the respective memory device is less than or equal to a predetermined value. In some embodiments, in response to detecting the trigger condition as to the respective memory device, memory controller 120 or a component thereof (e.g., recharacterization module 228, FIG. 2A) recharacterizes the respective memory device so as to be configured in a second storage density (e.g., X2 or X1), whereby the memory cells of the respective memory device are able to store less bits per cell in the second storage density than in the first storage density.

In FIG. 3, graph 310 shows the amount of free space available within the respective memory device (e.g., in terms of bytes) on the y-axis versus time or a number of PE cycles on the x-axis; however, graph 310 is discussed with reference to time on the x-axis for ease of discussion. Graph 310 shows that the amount of free space available within the respective memory device decreases from an initial amount (e.g., number of bytes) 312 to a minimum amount (e.g., number of bytes) 314 at time 302. The amount of free space remains constant (or approximately constant) at (or near) the minimum number of bytes 314 (e.g., greater than zero) until time 304, at or after which the respective memory device is recharacterized. In some embodiments, memory controller 120 maintains more than zero bytes of free space for the respective memory device for a number of reasons, including the need for storage space to rewrite valid data during garbage collection operations, and more generally over provisioning for write amplification in storage device 130. In some embodiments, write amplification is caused by garbage collection, wear leveling, random writes, and/or similar operations requiring over provisioning. After recharacterization of the respective memory device, the amount of free space 316 is less than the initial amount of free space 312.

In FIG. 3, graph 320 shows the amount of wear remaining for the respective memory device on the y-axis versus time or a number of PE cycles on the x-axis; however, graph 320 is discussed with reference to time on the x-axis for ease of discussion. For example, the wear remaining is associated with a percentage or ratio based on a number of PE cycles that the respective memory device is rated for versus a count of PE cycles performed on storage device 130. In another example, the wear remaining is associated with a percentage or ratio based on a number of bytes that the respective memory device is rated to write versus the number of bytes written to storage device 130. In another example, the wear remaining is the result of a predefined algorithm that takes into account a count of PE cycle performed on the respective memory device, a BER for data read from the respective memory device, and a number of bytes written to the respective memory (e.g., the wear remaining is the value of combined status metric field 258 for the respective memory device).

Graph 320 shows that the amount of wear remaining for the respective memory device starts at amount 322 when the respective memory device is configured in the first storage density and decreases. When the respective memory device is recharacterized so as to be configured in the second storage density at time 304, the amount of wear remaining for the respective memory device jumps to amount 324. The initial amount of wear remaining 322, when the respective memory device is configured in the first storage density, is less than amount 324 after the respective memory device is recharacterized so as to be configured in the second storage density. In one example, consistent with graph 320, a number of blocks of the respective memory device that were initially configured for use as X1 blocks are recharacterized as X3 blocks at time 304, resulting in an increased amount of wear remaining. In a second example, consistent with graph 320, most blocks (e.g., 98% or more) of the respective memory device are initially configured for use as X3 blocks, but have relatively small wear life (e.g., 300 P/E cycles), while after recharacterization at 304, the blocks are recharacterized as X1 blocks with much longer wear life (e.g., 10,000 P/E cycles), resulting in an overall increase in wear remaining for the device despite a decrease in total storage capacity.

In FIG. 3, graph 330 shows the total capacity of the respective memory device that is advertised to the host (e.g., in terms of bytes) on the y-axis versus time or a number of PE cycles on the x-axis; however, graph 330 is discussed with reference to time on the x-axis for ease of discussion. Graph 330 shows that the advertised capacity of the respective memory device starts at a first amount of bytes 332. After recharacterization of the respective memory device at time 304, the advertised capacity of the respective memory device is reduced to a second amount of bytes 334 that is less than the first amount of bytes 332.

Figure 4:
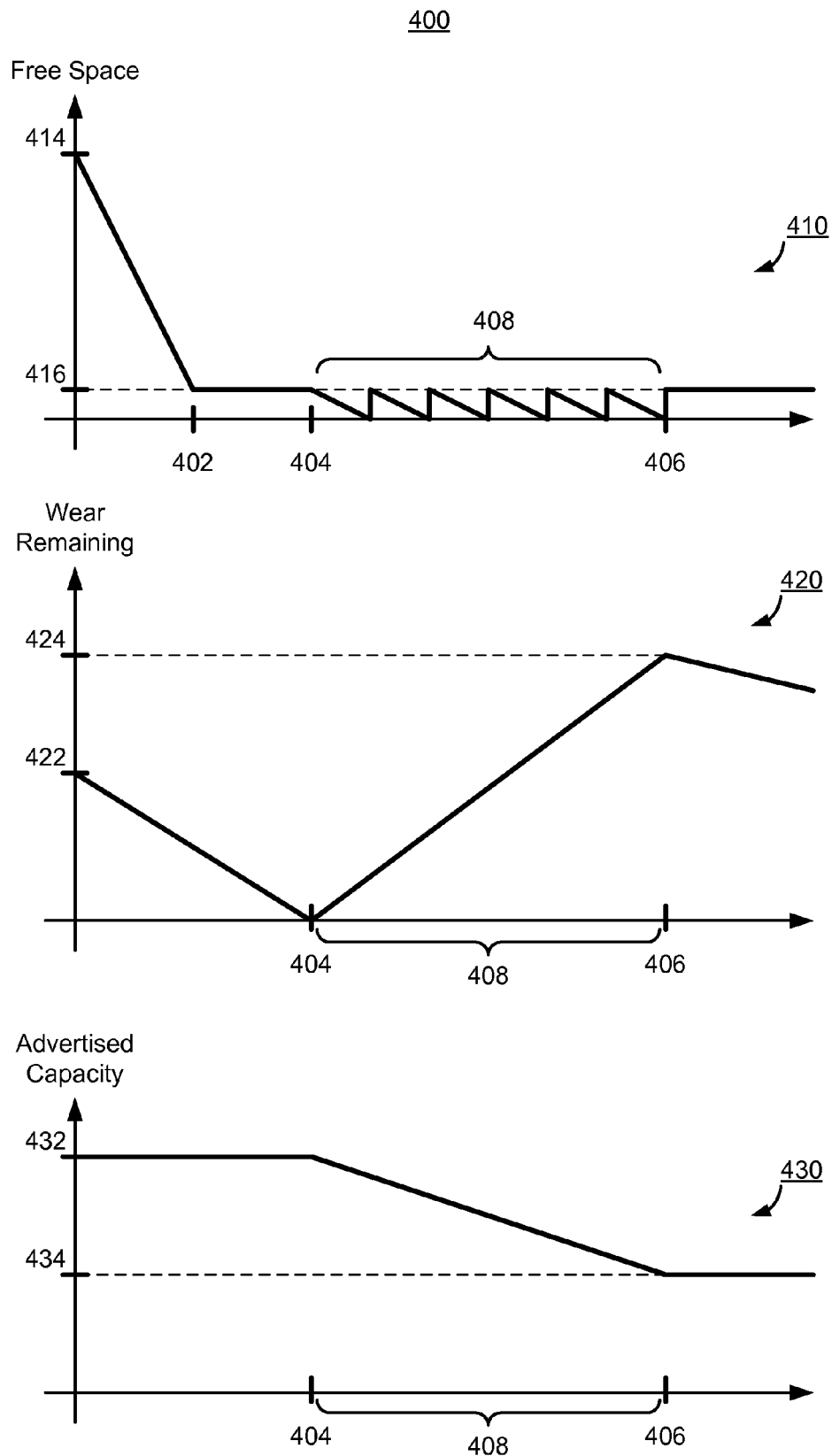
FIG. 4 is a diagram of a second implementation of a recharacterization process in accordance with some embodiments.

FIG. 4 illustrates a second implementation of a recharacterization process 400 in accordance with some embodiments. In one example, recharacterization process 400 is performed on a respective memory device associated with storage device 130 by memory controller 120, whereby one or more blocks are recharacterized at each step within window 408. Although window 408 is shown as encompassing six recharacterization operations, in some implementations window 408 encompasses tens, hundreds or thousands of recharacterization operations, each of which recharacterizes one or more blocks of the storage device. In another example, recharacterization process 400 is performed on a block associated with storage device 130 by memory controller 120, whereby one or more pages of the block are recharacterized at each step within window 408. Recharacterization process 400 will be discussed with reference to a respective memory device with six blocks for ease of discussion; however, one of skill in the art will appreciate how to apply the concepts discussed to a recharacterization process performed on a memory device with a different number of blocks (e.g., tens, or hundreds, or even thousands of blocks), or a different number of memory portions, where a memory portion is recharacterized at each step within window 408.

In FIG. 4, prior to time 404, the respective memory device is configured in a first storage density (e.g., X3 or X2). In FIG. 4, at or before time 404, memory controller 120 or a component thereof (e.g., trigger detection module 224, FIG. 2A) detects a trigger condition as to the respective memory device. In some embodiments, trigger detection module 224 detects the trigger condition as to the respective memory device when the amount of wear remaining for the respective memory device is less than or equal to a predetermined value that is greater than or equal to zero. In some embodiments, in response to detecting the trigger condition as to the respective memory device, memory controller 120 or a component thereof (e.g., recharacterization module 228, FIG. 2A) recharacterizes a first block of the respective memory device so as to be configured in a second storage density (e.g., X2 or X1), whereby the memory cells of the respective memory device are configured to store fewer bits per cell in the second storage density than in the first storage density. As further discussed below, in conjunction with the recharacterization, data previously stored in the first block (if still valid) is deleted and migrated elsewhere. In FIG. 4, in window 408 (i.e., from time 404 to time 406), recharacterization module 228 serially recharacterizes blocks of the respective memory device one block at a time until all the blocks in the respective memory device are recharacterized. In some embodiments, two or more blocks of the respective memory device are recharacterized in parallel.

In FIG. 4, graph 410 shows the amount of free space available within the respective memory device (e.g., in terms of bytes) on the y-axis versus time or a number of PE cycles on the x-axis; however, graph 410 is discussed with reference to time on the x-axis for ease of discussion. Graph 410 shows that the amount of free space available within the respective memory device decreases from an initial number of bytes 414 to a predefined number of bytes 416 at time 402. The amount of free space remains constant (or approximately constant) at the predefined number of bytes 416 (e.g., greater than zero) until time 404 when a first block of the respective memory device is recharacterized. In window 408 (i.e., from time 404 to time 406), the amount of free space decreases to zero and subsequently jumps to the predefined number of bytes 416 as the blocks of the respective memory device are serially recharacterized. After time 406 (e.g., when the last remaining block of the respective memory device is recharacterized), the amount of free space remains at the predefined number of bytes 416. In some alternative embodiments, the amount of free space does not decrease to zero, and instead decreases to a predefined minimum amount that is greater than zero.

In FIG. 4, graph 420 shows the amount of wear remaining for the respective memory device on the y-axis versus time or a number of PE cycles on the x-axis; however, graph 420 is discussed with reference to time on the x-axis for ease of discussion. For example, the wear remaining is associated with a percentage or ratio based on a number of PE cycles that the respective memory device is rated for versus a count of PE cycles performed on storage device 130. In another example, the wear remaining is associated with a percentage or ratio based on a number of bytes that the respective memory device is rated to write versus the number of bytes written to storage device 130. In another example, the wear remaining is the result of a predefined algorithm that takes into account a count of PE cycle performed on the respective memory device, a BER for data read from the respective memory device, and a number of bytes written to the respective memory (e.g., the wear remaining is the value of combined status metric field 258 for the respective memory device).

Graph 420 shows that the amount of wear remaining for the respective memory device starts at amount 422 when the respective memory device is configured in the first storage density and decreases towards zero. When the first block of the respective memory device is recharacterized so as to be configured in the second storage density at time 404, the amount of wear remaining for the respective memory device starts to increase. In graph 420, the amount of wear remaining continues to increase during window 408, as additional blocks are recharacterized, until it reaches amount 424 at time 406 (i.e., when the last block or group of blocks of the respective memory device is recharacterized). More generally, the amount of wear remaining after recharacterizing the blocks of the respective memory device in window 408 is greater than the wear remaining prior to recharacterizing the blocks of the respective memory device in window 408.

In FIG. 4, graph 430 shows the total capacity of the respective memory device that is advertised to the host (e.g., in terms of bytes) on the y-axis versus time or a number of PE cycles on the x-axis; however, graph 430 is discussed with reference to time on the x-axis for ease of discussion. Graph 430 shows that the advertised capacity of the respective memory device starts at a first amount of bytes 432. During window 408, the advertised capacity of the respective memory device decreases as the blocks of the respective memory device are serially recharacterized. After recharacterization of the blocks of the respective memory device at time 406, the advertised capacity of the respective memory device is a second amount of bytes 434 that is less than the first amount of bytes 432.

Figure 5A:
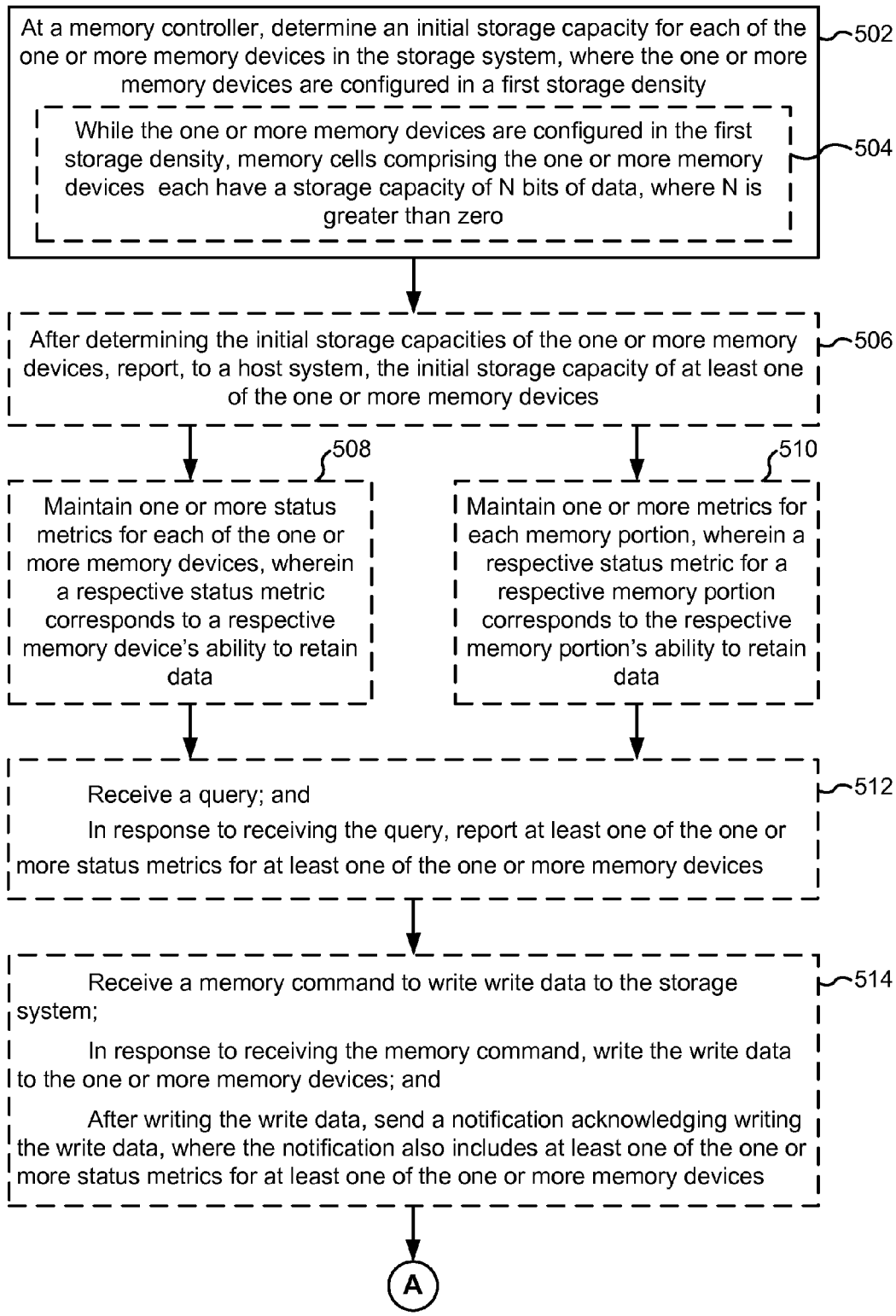
FIGS. 5A-5C illustrate a flowchart representation of a method of operation in a storage system in accordance with some embodiments.
Figure 5B:
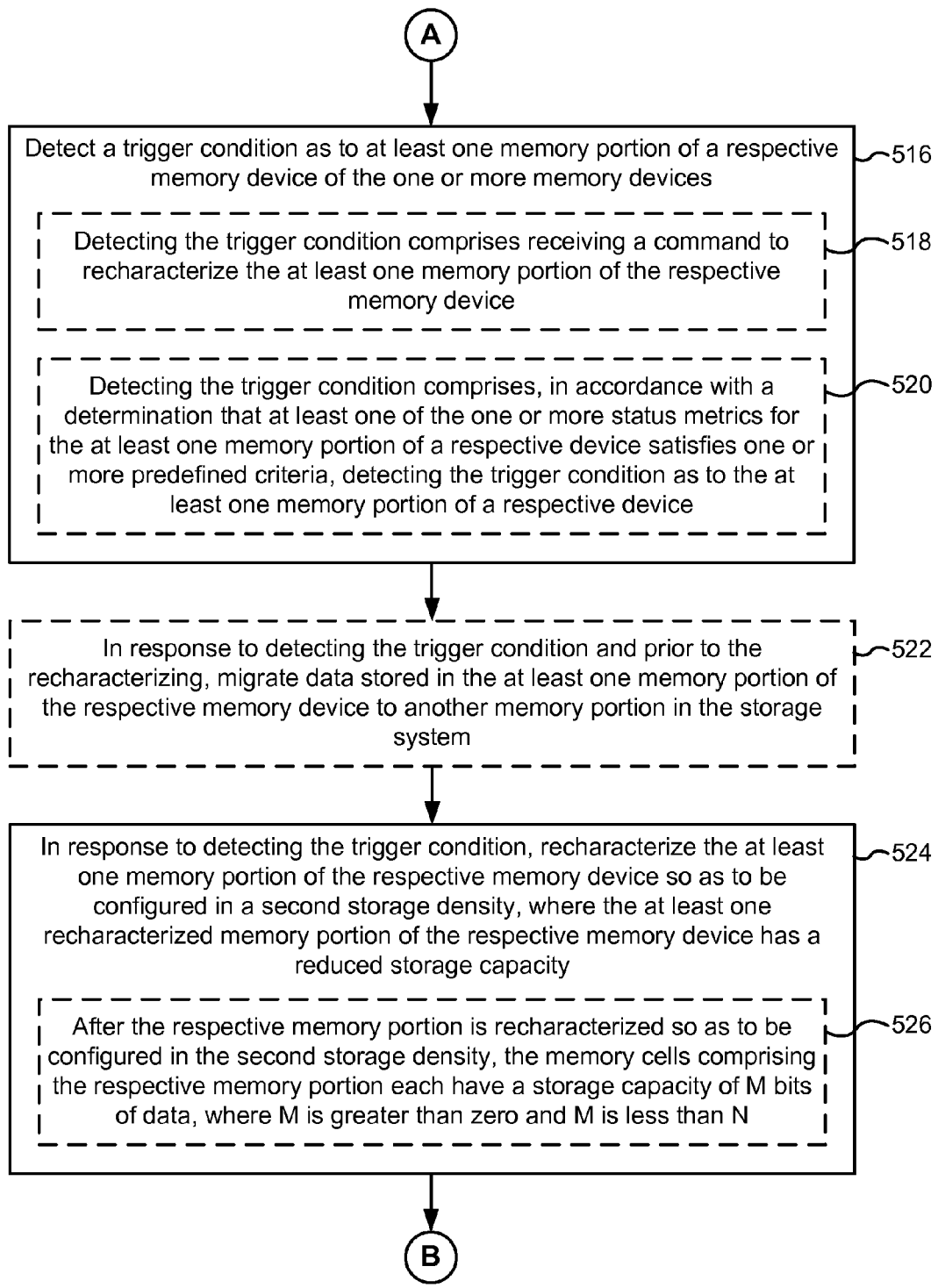
Figure 5C:
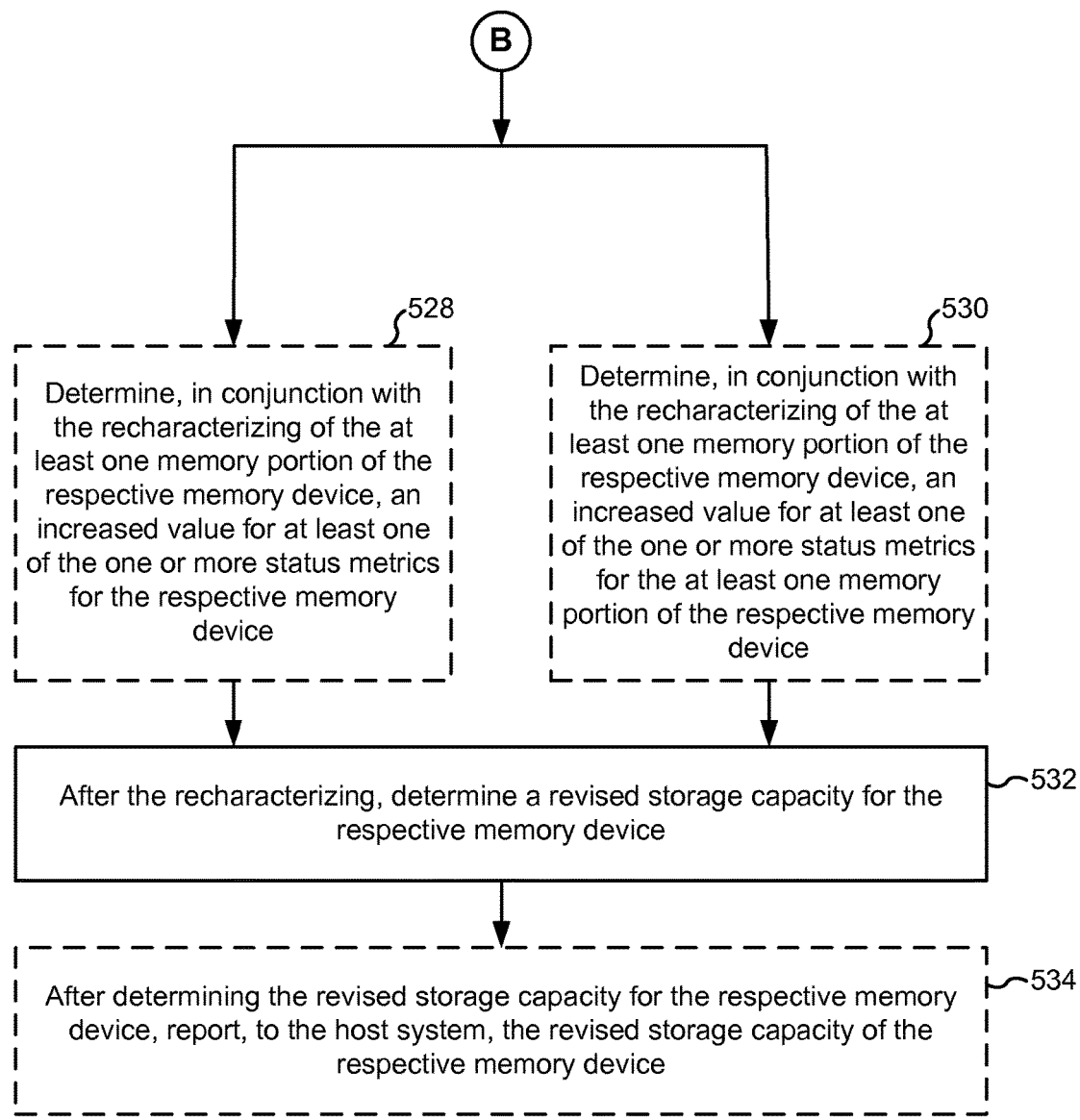

FIGS. 5A-5C illustrate a flowchart representation of a method 500 of operation in a storage system with a memory controller and one or more memory devices in accordance with some embodiments. At least in some implementations, method 500 is performed by the memory controller (e.g., memory controller 120, FIG. 1) or one or more components thereof (e.g., management module 121, FIGS. 1 and 2A). In some embodiments, method 500 is performed by a memory controller (e.g., memory controller 120, FIG. 1) distinct from and coupled with the storage device (e.g., storage device 130 which includes the one or more memory devices) by one or more connections (e.g., connections 103, FIG. 1). A respective memory device of the one or more memory devices includes a plurality of memory portions such as die, groups of blocks, blocks, word lines, pages, or the like. In some embodiments, method 500 is governed by instructions that are stored in a non-transitory computer readable storage medium and the instructions are executed by one or more processors of a device (e.g., one or more processing units (CPUs) 122 of management module 121, FIGS. 1 and 2A). Optional operations are indicated by dashed lines (e.g., boxes with dashed-line borders).

The memory controller determines (502) an initial storage capacity for each of the one or more memory devices, where the one or more memory devices are configured in a first storage density. In some embodiments, the memory cells of the one or more memory devices are configured as N bit memory cells (e.g., X1, X2, or X3). In some embodiments, the memory cells of the one or more memory devices are operable at a first storage density (e.g., X3) and also at one or more other (typically lower) storage densities (e.g., X2 and X1). In some embodiments, memory controller 120 determines (e.g., upon startup or power-on of data storage system 100) an initial storage capacity for each of the one or more memory devices associated with storage device 130 based on the storage densities of the one or more memory devices. In some embodiments, after determining the initial storage capacity for a respective memory device, memory controller 120 or a component thereof (e.g., metric maintaining module 222, FIG. 2A) stores the initial storage capacity for the respective memory device in storage capacity field 256 of the characterization vector for the respective memory device, where storage capacity field 256 indicates the current storage capacity of the respective memory device.

In some embodiments, while the one or more memory devices are configured in the first storage density, memory controller 120 writes data to and reads data from the one or more memory devices. In some embodiments, memory controller 120 causes data to be written to and read from pages in a respective memory device or portion thereof according to one or more configuration parameters (e.g., storage density, ECC technique, and programming parameter(s)) indicated in a characterization vector for the respective memory device or portion thereof (e.g., a group of blocks, block, word line, or page). For example, while the respective memory device is configured in the first storage density, memory controller 120 or a component thereof (e.g., request handling module 218, FIG. 2A) receives a command from the host (e.g., computer system 110, FIG. 1) to write user data (sometimes also called write data) to a logical address or set of logical addresses. Continuing with this example, memory controller 120 uses logical-to-physical mapping 236 (FIG. 2A) to map the logical address or set of logical addresses identified by the write command to physical addresses of one or more pages in the respective memory device or portion thereof. Continuing with this example, memory controller 120 selects a characterization vector associated with the respective memory device or portion thereof from characterization vector table 234 (FIGS. 2A-2B) based on the physical addresses so as to determine an ECC technique with which to encode the user data, programming parameter(s) for writing the user data to the one or more pages, and the first storage density associated with memory cells in the respective memory device or portion thereof. Continuing with this example, encoder 126 (FIG. 1) encodes the user data according to the determined ECC technique, and memory controller 120 or a component thereof (e.g., data read module 212, FIG. 2A or data write module 214, FIG. 2A) causes read/write circuitry in storage medium I/O 128 (FIG. 1) or read/write circuitry 135 (FIG. 1) to write the encoded user data (i.e., one or more codewords) to the one or more pages in the respective memory device or portion thereof according to the determined programming parameter(s).

In some embodiments, while the one or more memory devices are configured in the first storage density, memory cells comprising the one or more memory devices each have (504) a storage capacity of N bits of data, where N is greater than zero. For example, when the one or more memory devices comprising storage device 130 are configured in the first storage density, the memory cells of the one or more memory devices are configured as X3 memory cells, and thus have a storage capacity of 3 bits of data per memory cell.

In some embodiments, after determining the initial storage capacities of the one or more memory devices, the memory controller reports (506), to a host system, the initial storage capacity of at least one of the one or more memory devices. In some embodiments, after determining the initial storage capacities for each of the one or more memory devices associated with storage device 130, memory controller 120 or a component thereof (e.g., reporting module 219, FIG. 2A) reports to the host (e.g., computer system 110, FIG. 1) the storage capacity of at least one of the one or more memory devices associated with storage device 130. In some embodiments, reporting module 219 automatically reports the storage capacity of at least one of the one or more memory devices. In some embodiments, reporting module 219 reports the storage capacity of at least one of the one or more memory devices in response to a query from the host.

As a practical matter, it is noted that in some embodiments storage device 130 will have a preset or predetermined initial storage capacity, based on a presumption that most or all of the memory cells of the storage device will be configured with a preset storage density (e.g., 98% of the memory cells configured as X3 memory cells and 2% of the memory cells configured as X1 memory cells), and also a presumption that storage device 130 will have a preset amount of over provisioning (e.g., 10% over provisioning). In such embodiments, the initially reported storage capacity mentioned above is the preset initial storage capacity unless an overriding condition is detected, requiring that the initial storage capacity reported be lower than the preset storage capacity. Examples of overriding conditions are a larger number of unusable die, blocks or pages than expected, or a larger number of blocks or pages that need to be configured at a lower storage density (e.g., X1 instead of X3) than expected.

In some embodiments, the memory controller maintains (508) one or more status metrics for each of the one or more memory devices, where a respective status metric corresponds to a respective memory device's ability to retain data. In some embodiments, memory controller 120 or a component thereof (e.g., metric maintaining module 222, FIG. 2A) maintains one or more status metrics for each of the one or more memory devices associated with storage device 130. In some embodiments, the one or more status metrics indicate a respective memory device's ability to retain data. For example, as the respective memory device ages, the one or more status metrics reflect the respective memory device's diminished ability to retain data (e.g., data read from the respective memory device includes more errors as the respective memory device ages). In some embodiments, the one or more status metrics associated with a respective memory device are stored in a characterization vector corresponding to the respective memory device. In some embodiments, the one or more status metrics stored in the characterization vector for the respective memory device include: (a) a bytes written field 260 indicating a number of bytes of data written to pages in the respective memory device; (b) a PE cycle field 262 indicating a current count of the number of PE cycles performed on the respective memory device; (c) an BER field 264 indicating a number of errors included in a codeword read from pages of the respective memory device; and (d) other usage information 266 indicating the health, performance, and/or endurance of the respective memory device.

In some embodiments, memory controller 120 or a component thereof (e.g., metric maintaining module 222, FIG. 2A) maintains a combined status metric for each of the one or more memory devices associated with storage device 130. For example, the combined status metric indicates an amount of wear remaining for a respective memory device. In some embodiments, the combined status metric associated with a respective memory device is stored in a characterization vector corresponding to the respective memory device. In some embodiments, combined status metric 258 is associated with the output of a predefined algorithm (e.g., computed by metric maintaining module 222, FIG. 2A) that takes into account one or more usage parameters and/or device performance parameters associated with the respective memory device. For example, the predefined algorithm incorporates one or more of: (a) a number of bytes written to the respective memory device; (b) a count of PE cycles performed on respective memory device; (c) a BER for codewords read from page(s) of the respective memory device; and (d) other usage or performance information associated with the respective memory device.

In some embodiments, the memory controller maintains (510) one or more metrics for each memory portion of the plurality of memory portions of the respective memory device, where a respective status metric for a respective memory portion corresponds to the respective memory portion's ability to retain data. In some embodiments, memory controller 120 or a component thereof (e.g., metric maintaining module 222, FIG. 2A) maintains one or more status metrics for each memory portion (of the plurality of memory portions) of the one or more memory devices associated with storage device 130. In some embodiments, the one or more status metrics indicate a respective memory portion's ability to retain data. For example, as the respective memory portion ages, the one or more status metrics reflect the respective memory portion's diminished ability to retain data (e.g., data read from the respective memory portion includes more errors as the respective memory portion ages). In some embodiments, the one or more status metrics associated with a respective memory portion are stored in a characterization vector corresponding to the respective memory portion. In some embodiments, the one or more status metrics stored in the characterization vector for the respective memory portion include: (a) a bytes written field 260 indicating a number of bytes of data written to pages in the respective memory portion; (b) a PE cycle field 262 indicating a current count of the number of PE cycles performed on the respective memory portion; (c) an BER field 264 indicating a number of errors included in a codeword read from pages of the respective memory portion; and (d) other usage or performance information 266 indicating the health, performance, and/or endurance of the respective memory portion.

In some embodiments, memory controller 120 or a component thereof (e.g., metric maintaining module 222, FIG. 2A) maintains a combined status metric for each respective memory portion of the one or more memory devices associated with storage device 130. For example, the combined status metric indicates an amount of wear remaining for a respective memory portion. In some embodiments, the combined status metric associated with a respective memory portion is stored in a characterization vector corresponding to the respective memory portion. In some embodiments, combined status metric 258 is associated with the output of a predefined algorithm (e.g., computed by metric maintaining module 222, FIG. 2A) that takes into account one or more usage and/or performance parameters associated with the respective memory portion. For example, the predefined algorithm incorporates one or more of: (a) a number of bytes written to the respective memory portion; (b) a count of PE cycles performed on respective memory portion; (c) a BER for codewords read from page(s) of the respective memory portion; and (d) other usage or performance information associated with the respective memory portion.

In some embodiments, the memory controller receives (512) a query, and, in response to receiving the query, the memory controller reports at least one of the one or more status metrics for at least one of the one or more memory devices. In some embodiments, the query is received from the host (e.g., computer system 100, FIG. 1), or a process internal to data storage system 100, or an accelerator module associated with storage device 130. For example, the host system sends a query to memory controller 120 for the status of a logical address or set of logical addresses. Continuing with this example, memory controller 120 uses logical-to-physical mapping 236 (FIG. 2A) to map the logical address or set of logical addresses identified by the query to physical addresses of memory devices or memory portions in storage device 130. Continuing with this example, memory controller 120 selects a characterization vector associated with a respective memory device or portion thereof from characterization vector table 234 (FIGS. 2A-2B) based on the physical addresses so as to determine current status metric(s) for the respective memory device or portion thereof. Thereafter, in this example, memory controller 120 or a component thereof (e.g., reporting module 219, FIG. 1) reports at least one of the current status metrics for the respective memory device or portion thereof to the host. For example, reporting module 219 reports the combined status metric (i.e., the wear remaining) for a respective memory device identified in the query to the host.

In some embodiments, the memory controller (514): receives a memory command to write write data to the storage system; in response to receiving the memory command, writes the write data to the one or more memory devices; and, after writing the write data, sends a notification acknowledging writing the write data, where the notification also includes at least one of the one or more status metrics for at least one of the one or more memory devices. For example, memory controller 120 or a component thereof (e.g., request handling module 218, FIG. 2A) receives a command from the host (e.g., computer system 110, FIG. 1) to write user data (sometimes also called write data) to a logical address or set of logical addresses. Continuing with this example, memory controller 120 uses logical-to-physical mapping 236 (FIG. 2A) to map the logical address or set of logical addresses identified by the write command to physical addresses of memory devices or portions in storage device 130. Continuing with this example, memory controller 120 selects a characterization vector associated with a respective memory device or portion thereof from characterization vector table 234 (FIGS. 2A-2B) based on the physical addresses so as to determine an ECC technique with which to encode the write data, programming parameter(s) for writing the write data to the one or more pages, the storage density associated with memory cells in the respective memory device or portion thereof, and current status metric(s) for the respective memory device or portion thereof. Alternatively, memory controller 120 selects a characterization vector associated with a respective memory device or portion thereof so as to determine one or more of the aforementioned parameters and/or metrics.

Continuing with this example, encoder 126 (FIG. 1) encodes the write data according to the determined ECC technique, and memory controller 120 or a component thereof (e.g., data read module 212, FIG. 2A or data write module 214, FIG. 2A) causes read/write circuitry in storage medium I/O 128 (FIG. 1) or read/write circuitry 135 (FIG. 1) to write the encoded user data (i.e., a codeword) to the respective memory device or portion thereof according to the determined programming parameter(s). Thereafter, in this example, memory controller 120 or a component thereof (e.g., reporting module 219, FIG. 1) acknowledges successful completion of the write command and also reports at least one of the current status metric(s) for the respective memory device or portion thereof to the host.

The memory controller detects (516) a trigger condition as to at least one memory portion of a respective device of the one or more memory devices. In some embodiments, memory controller 120 or a component thereof (e.g., trigger detection module 224, FIG. 2A) detects a trigger condition as to a memory portion of a respective memory device or as to a respective memory device associated with storage device 130. For example, trigger detection module 224 automatically detects a trigger condition as to at least one memory portion of a respective memory device associated with storage device 130.

In some embodiments, the trigger condition is detected by receiving (518) a command (e.g., from the host system) to recharacterize the at least one memory portion of the respective memory device. In some embodiments, memory controller 120 or a component thereof (e.g., trigger detection module 224, FIG. 2A) detects a trigger condition as to a memory portion of a respective memory device or as to the respective memory device associated with storage device 130 in response to receiving a recharacterization command from the host (e.g., computer system 110, FIG. 1) to recharacterize the memory portion of the respective memory device or as to the respective memory device. For example, the host sends the recharacterization command as to a respective memory device when the respective memory device enters a read-only mode (e.g., indicating that the respective memory device has reached end-of-life conditions). In another example, the host monitors the status metric(s) corresponding to the memory devices and/or memory portions thereof, and the host sends the recharacterization command as to a respective memory device or a respective memory portion when a status metric for the respective memory device or the respective memory portion falls below a predetermined threshold (e.g., the count of PE cycles performed on the respective memory device or the respective memory portion exceeds a predetermined count, or the number of bytes written to the respective memory device or the respective memory portion exceeds a predetermined number of bytes).

In some embodiments, the trigger condition is detected, in accordance with a determination (520) that at least one of the one or more status metrics for the at least one memory portion of a respective device satisfies one or more predefined criteria, by detecting the trigger condition as to the at least one memory portion of a respective device. In some embodiments, memory controller 120 or a component thereof (e.g., trigger detection module 224, FIG. 2A) detects a trigger condition as to a memory portion of a respective memory device or as to a respective memory device when at least one of the one or more status metrics corresponding to the memory portion of the respective memory device or the respective memory device satisfies one or more predefined criteria. In some embodiments, the one or more status metrics are stored in a characterization vector corresponding to the respective memory portion or the respective memory device. For example, memory controller 120 detects the trigger condition for a respective memory portion when the one or more status metrics corresponding to the respective memory portion indicate that a total number or average number of bytes written to pages in the respective memory portion exceeds a predetermined number of bytes, that a count of PE cycles performed on the respective memory portion exceeds a predetermined count, or that the value of a combined status metric for the respective memory portion is below a predefined recharacterization threshold. As such, continuing with this example, memory controller 120 triggers recharacterization of the respective memory portion from the first storage density to a second storage density, where the respective memory portion is able to store less data when configured in the second storage density.

For example, with reference to graph 320 of FIG. 3, trigger detection module 224 detects the trigger condition as to a respective memory device at time 304 when the amount of wear remaining for the respective memory device is equal to zero (or other predefined threshold). In another example, with reference to graph 420 of FIG. 4, trigger detection module 224 detects the trigger condition as to a respective memory device at time 404 when the amount of wear remaining for the respective memory device is equal to zero (or other predefined threshold). In one example, a memory portion is rated by the manufacturer to write up X bytes before a bit error rate associated with the memory portion becomes intolerable. When X bytes have been written to the memory portion, memory controller 120 detects the trigger as to the memory portion and recharacterizes the memory portion so as to be configured in a lower storage density. In another example, when Y % of X bytes (where Y % is less than 100%) have been written to the memory portion, memory controller 120 detects the trigger as to the memory portion and recharacterizes the memory portion so as to be configured in a lower storage density. In a further example, memory controller 120 detects the trigger as to a memory portion when a combined status metric for the memory portion falls below a predefined recharacterization threshold, where the combined status metric includes additional history, performance, and/or health factors (e.g., BER and operating conditions) in addition to the number of bytes written to the memory portion.

In some embodiments, in response to detecting the trigger condition and prior to the recharacterizing, the memory controller migrates (522) data stored in the at least one memory portion of the respective memory device to another memory portion in the storage system. In some embodiments, after detecting the trigger condition as to the respective memory portion and prior to recharacterizing the respective memory portion, memory controller 120 or a component thereof (e.g., migration module 226, FIG. 2A) migrates data stored in the respective memory portion. In some embodiments, migration module 226 automatically migrates the data stored by the respective memory portion prior to recharacterizing the portion without receiving a command from the host. In some embodiments, migration module 226 migrates the data stored by the respective memory portion after receiving a recharacterization command from the host. Alternatively, in some embodiments, the host (e.g., computer system 110, FIG. 1) migrates the data stored in the respective memory portion instead of memory controller 120.

In some embodiments, migration is not required prior to recharacterization when data storage system 100 is configured to redundantly store data, for example using a RAID configuration or maintaining at least N replicable copies of the data (e.g., N≥2). In some embodiments, when data storage system 100 is not distributed or redundantly configured, data is migrated prior to recharacterization. In one example, the data stored by the respective memory portion is migrated to a different memory device associated with data storage system 100 than the memory device including the respective memory portion. In another example, the data stored by the respective memory portion is migrated to a different memory portion in the same memory device that includes the respective memory portion.

In response to detecting the trigger condition, the memory controller recharacterizes (524) the at least one memory portion of the respective memory device so as to be configured in a second storage density, where the at least one recharacterized memory portion of the respective memory device has a reduced storage capacity. In some embodiments, in response to detecting the trigger condition as to the at least one memory portion, memory controller 120 or a component thereof (e.g., recharacterization module 228, FIG. 2A) recharacterizes the at least one memory portion of the respective memory device so as to be configured in the second storage density. In some embodiments, after the recharacterizing, memory controller 120 or a component thereof (e.g., metric maintaining module 222, FIG. 2A) updates the storage density field 252 of the characterization vector for the at least one memory portion to indicate that the at least one memory portion is configured in the second storage density.

In some embodiments, after the respective memory portion is recharacterized so as to be configured in the second storage density, memory cells in the respective memory portion each have (526) a storage capacity of M bits of data, where M is greater than zero and M is less than N. For example, when configured in the first storage density, memory cells of the at least one memory portion are configured to store N bits of data (e.g., X3). Continuing with this example, after recharacterizing the at least one memory portion so as to be configured in the second storage density, memory cells of the at least one memory portion are configured to store M bits of data (e.g., X2), where N>M.

In some embodiments, maintaining the endurance metric for each of the one or more memory devices includes (528), determining, in conjunction with the recharacterizing of the at least one memory portion of the respective memory device, an increased value for at least one of the one or more status metrics for the respective memory device. In some embodiments, after recharacterizing the at least one memory portion so as to be configured in the second storage density, at least one of the status metrics associated with the memory device corresponding to the at least one memory portion increases. For example, with reference to FIG. 4, as blocks of the respective memory device are serially recharacterized in window 408, the wear remaining in graph 420 for the respective memory device increases. In some embodiments, after the recharacterizing, memory controller 120 or a component thereof (e.g., metric maintaining module 222, FIG. 2A) updates one or more status metrics in the characterization vector for the respective memory device that includes the at least one memory portion to indicate that the at least one memory portion is configured in the second storage density. For example, metric maintaining module 222 increases the combined status metric 258 for the respective memory device to indicate a greater amount of wear remaining while the at least one memory portion of the respective memory device is configured in the second storage density.

In some embodiments, maintaining the endurance metric for each memory portion includes (530), determining, in conjunction with the recharacterizing of the at least one memory portion of the respective memory device, an increased value for at least one of the one or more status metrics for the at least one memory portion of the respective memory device. In some embodiments, after the recharacterizing, memory controller 120 or a component thereof (e.g., metric maintaining module 222, FIG. 2A) updates one or more status metrics in the characterization vector for the at least one memory portion to indicate that the at least one memory portion is configured in the second storage density. Alternatively, in some embodiments, the combined status metric is insensitive to the current storage density. Instead, for example, when a write is performed to a memory portion while configured as X3, PE cycles field 262 in the characterization vector for the memory portion is incremented by 3, whereas when the write is performed to the memory portion while configured as X1, PE cycles field 262 in the characterization vector for the memory portion is incremented by 1.

After the recharacterizing, the memory controller determines (532) a revised storage capacity for the respective memory device. In some embodiments, after recharacterizing the at least one memory portion, memory controller 120 determines a revised storage capacity for the respective memory device that includes the at least one memory portion. In some embodiments, after determining the revised storage capacity for the respective memory device, memory controller 120 or a component thereof (e.g., metric maintaining module 222, FIG. 2A) updates the storage capacity field 256 of the characterization vector for the respective memory device to indicate the revised storage capacity for the respective memory device. In FIG. 3, for example, after the respective memory device is recharacterized at time 304, graph 330 shows that the advertised storage capacity for the respective memory device is reduced from amount 332 to amount 334. In one example, when the respective memory device is recharacterized from X3 to X2, the respective memory device's storage capacity decreases by approximately 33.33%. In another example, when the respective memory device is recharacterized from X2 to X1, the respective memory device's storage capacity decreases by approximately 50%.

In some embodiments, after determining the revised storage capacity for the respective memory device, the memory controller reports (534), to the host system, the revised storage capacity of the respective memory device. In some embodiments, after determining the revised storage capacity for the respective memory device including the at least one memory portion, memory controller 120 or a component thereof (e.g., reporting module 219, FIG. 2A) reports to the host (e.g., computer system 110, FIG. 1) the revised storage capacity of the respective memory device. In some embodiments, reporting module 219 automatically reports the revised storage capacity to the host. In some embodiments, reporting module 219 reports the revised storage capacity to the host in response to a query from the host, or alternatively, in response to a host command such as a read, write or erase command.

In some embodiments, while the at least one memory portion of the respective memory device is configured in the second storage density, memory controller 120 writes data to and reads data from the at least one memory portion of the respective memory device. For example, after recharacterizing the at least one memory portion, memory controller 120 causes data to be written to and read from pages in the at least one memory portion according to the configuration parameters (e.g., the second storage density, ECC technique, and programming parameter(s)) indicated in the updated characterization vector for the at least one memory portion.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible (e.g., a NOR memory array). NAND and NOR memory configurations are exemplary, and memory elements may be otherwise configured.

The semiconductor memory elements located within and/or over a substrate may be arranged in two or three dimensions, such as a two dimensional memory structure or a three-dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three-dimensional memory structure may be vertically arranged as a stack of multiple two dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration (e.g., in an x-z plane), resulting in a three-dimensional arrangement of memory elements with elements on multiple vertically stacked memory planes. Other configurations of memory elements in three dimensions can also constitute a three-dimensional memory array.

By way of non-limiting example, in a three-dimensional NAND memory array, the memory elements may be coupled together to form a NAND string within a single horizontal (e.g., x-z) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two dimensional memory arrays or three-dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

The term "three-dimensional memory device" (or 3D memory device) is herein defined to mean a memory device having multiple memory layers or multiple levels (e.g., sometimes called multiple memory device levels) of memory elements, including any of the following: a memory device having a monolithic or non-monolithic 3D memory array, some non-limiting examples of which are described above; or two or more 2D and/or 3D memory devices, packaged together to form a stacked-chip memory device, some non-limiting examples of which are described above.

One of skill in the art will recognize that this invention is not limited to the two dimensional and three-dimensional exemplary structures described but cover all relevant memory structures within the spirit and scope of the invention as described herein and as understood by one of skill in the art.

It will be understood that, although the terms "first," "second," etc. may be used herein to describe various elements, these elements should not be limited by these terms. These terms are only used to distinguish one element from another. For example, a first trigger condition could be termed a second trigger condition, and, similarly, a second trigger condition could be termed a first trigger condition, without changing the meaning of the description, so long as all occurrences of the "first trigger condition" are renamed consistently and all occurrences of the "second trigger condition" are renamed consistently. The first trigger condition and the second trigger condition are both trigger conditions, but they are not the same trigger condition.

The terminology used herein is for the purpose of describing particular embodiments only and is not intended to be limiting of the claims. As used in the description of the embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific implementations. However, the illustrative discussions above are not intended to be exhaustive or to limit the claims to the precise forms disclosed. Many modifications and variations are possible in view of the above teachings. The implementations were chosen and described in order to best explain principles of operation and practical applications, to thereby enable others skilled in the art.

What is claimed is:

1. A method of operation in a storage system that comprises a memory controller and one or more memory devices, each with a plurality of memory portions, the method comprising:
at the memory controller:
maintaining one or more status metrics for each memory portion of the plurality of memory portions of the one or more memory devices, wherein each of the one or more status metrics for a respective memory portion corresponds to the respective memory portion's ability to retain data;
determining an initial storage capacity for each of the one or more memory devices, wherein the one or more memory devices are configured in a first storage density;
in accordance with a determination that at least one of the one or more status metrics for at least one memory portion of a respective memory device of the one or more memory devices satisfies one or more predefined criteria, detecting a trigger condition as to the at least one memory portion of the respective memory device, wherein detecting the trigger condition as to the at least one memory portion of the respective memory device includes receiving a command from a host system to recharacterize the at least one memory portion of the respective memory device;
in response to detecting the trigger condition, recharacterizing the at least one memory portion of the respective memory device so as to be configured in a second storage density, wherein the at least one recharacterized memory portion of the respective memory device has a reduced storage capacity;
after the recharacterizing, determining a revised storage capacity for the respective memory device;
after determining the initial storage capacities of the one or more memory devices, reporting, to the host system, the initial storage capacity of at least one of the one or more memory devices; and
after determining the revised storage capacity for the respective memory device, reporting, to the host system, the revised storage capacity of the respective memory device.

2. The method of claim 1, further comprising:
in response to detecting the trigger condition and prior to the recharacterizing, migrating data stored in the at least one memory portion of the respective memory device to another memory portion in the storage system.

3. The method of claim 1, further comprising:
receiving a query; and
in response to receiving the query, reporting at least one of the one or more status metrics for at least one of the one or more memory devices.

4. The method of claim 1, further comprising:
receiving a memory command to write write data to the storage system;
in response to receiving the memory command, writing the write data to the one or more memory devices; and
after writing the write data, sending a notification acknowledging writing the write data, wherein the notification also includes at least one of the one or more status metrics for at least one of the one or more memory devices.

5. The method of claim 1, wherein maintaining the one or more status metrics for each memory portion includes determining, in conjunction with the recharacterizing of the at least one memory portion of the respective memory device, an increased value for at least one of the one or more status metrics for the at least one memory portion of the respective memory device, wherein the increased value for the at least one memory portion corresponds to an increased amount of wear remaining with respect to the at least one memory portion.

6. The method of claim 1, wherein the initial storage capacity reported to the host system is initial storage capacity excluding over provisioning and wherein the revised storage capacity reported to the host system is revised storage capacity excluding over provisioning.

7. The method of claim 1, wherein, while the one or more memory devices are configured in the first storage density, memory cells comprising the one or more memory devices have a storage capacity of N bits of data, wherein N is greater than zero, and
wherein, after the at least one memory portion is recharacterized so as to be configured in the second storage density, the memory cells comprising the at least one memory portion each have a storage capacity of M bits of data, wherein M is greater than zero and M is less than N.

8. The method of claim 1, wherein the one or more memory devices are flash memory devices, and
wherein each portion of the plurality of memory portions of the respective memory device comprises one of the set of: one die, one erase block, and one page.

9. The method of claim 1, wherein the one or more memory devices comprises one or more three-dimensional (3D) memory devices, each with a 3D array of memory cells, and circuitry associated with operation of memory elements in the one or more 3D memory devices.

10. The method of claim 9, wherein the circuitry and one or more memory elements in a respective 3D memory device, of the one or more 3D memory devices, are on the same substrate.

11. A storage system, comprising:
a storage device including one or more memory devices, each with a plurality of memory portions; and
a memory controller with one or more processors and memory storing one or more programs to be executed by the one or more processors, the one or more programs comprising instructions for:
maintaining one or more status metrics for each memory portion of the plurality of memory portions of the one or more memory devices, wherein each of the one or more status metrics for a respective memory portion corresponds to the respective memory portion's ability to retain data;
determining an initial storage capacity for each of the one or more memory devices, wherein the one or more memory devices are configured in a first storage density;
in accordance with a determination that at least one of the one or more status metrics for at least one memory portion of a respective memory device of the one or more memory devices satisfies one or more predefined criteria, detecting a trigger condition as to the at least one memory portion of the respective memory device, wherein detecting the trigger condition as to the at least one memory portion of the respective memory device includes receiving a command from a host system to recharacterize the at least one memory portion of the respective memory device;

in response to detecting the trigger condition, recharacterizing the at least one memory portion of the respective memory device so as to be configured in a second storage density, wherein the at least one recharacterized memory portion of the respective memory device has a reduced storage capacity;

after the recharacterizing, determining a revised storage capacity for the respective memory device;

after determining the initial storage capacities of the one or more memory devices, reporting, to the host system, the initial storage capacity of at least one of the one or more memory devices; and after determining the revised storage capacity for the respective memory device, reporting, to the host system, the revised storage capacity of the respective memory device.

12. The storage system of claim 11, wherein maintaining the one or more status metrics for each memory portion includes determining, in conjunction with the recharacterizing of the at least one memory portion of the respective memory device, an increased value for at least one of the one or more status metrics for the at least one memory portion of the respective memory device, wherein the increased value for the at least one memory portion corresponds to an increased amount of wear remaining with respect to the at least one memory portion.

13. The storage system of claim 11, wherein the initial storage capacity reported to the host system is initial storage capacity excluding over provisioning and wherein the revised storage capacity reported to the host system is revised storage capacity excluding over provisioning.

14. The storage system of claim 11, wherein the one or more programs further comprise instructions for:

in response to detecting the trigger condition and prior to the recharacterizing, migrating data stored in the at least one memory portion of the respective memory device to another memory portion in the storage system.

15. A non-transitory computer readable storage medium storing one or more programs, the one or more programs comprising instructions, which, when executed by a memory controller with one or more processors, cause the memory controller to perform operations comprising:

maintaining one or more status metrics for each memory portion of a plurality of memory portions of one or more memory devices, wherein each of the one or more status metrics for a respective memory portion corresponds to the respective memory portion's ability to retain data;

determining an initial storage capacity for each of the one or more memory devices, wherein the one or more memory devices are configured in a first storage density and the one or more memory devices each include a plurality of memory portions;

in accordance with a determination that at least one of the one or more status metrics for at least one memory portion of a respective memory device of the one or more memory devices satisfies one or more predefined criteria, detecting a trigger condition as to the at least one memory portion of the respective memory device, wherein detecting the trigger condition as to the at least one memory portion of the respective memory device includes receiving a command from a host system to recharacterize the at least one memory portion of the respective memory device;

in response to detecting the trigger condition, recharacterizing the at least one memory portion of the respective memory device so as to be configured in a second storage density, wherein the at least one recharacterized memory portion of the respective memory device has a reduced storage capacity;

after the recharacterizing, determining a revised storage capacity for the respective memory device;

after determining the initial storage capacities of the one or more memory devices, reporting, to the host system, the initial storage capacity of at least one of the one or more memory devices; and after determining the revised storage capacity for the respective memory device, reporting, to the host system, the revised storage capacity of the respective memory device.

16. The non-transitory computer readable storage medium of claim 15, wherein maintaining the one or more status metrics for each memory portion includes determining, in conjunction with the recharacterizing of the at least one memory portion of the respective memory device, an increased value for at least one of the one or more status metrics for the at least one memory portion of the respective memory device, wherein the increased value for the at least one memory portion corresponds to an increased amount of wear remaining with respect to the at least one memory portion.

17. The non-transitory computer readable storage medium of claim 15, wherein the initial storage capacity reported to the host system is initial storage capacity excluding over provisioning and wherein the revised storage capacity reported to the host system is revised storage capacity excluding over provisioning.

18. The non-transitory computer readable storage medium of claim 15, wherein the one or more programs further comprise instructions for:

in response to detecting the trigger condition and prior to the recharacterizing, migrating data stored in the at least one memory portion of the respective memory device to another memory portion in the storage system.

\* \* \* \* \*